US008467760B2

(12) United States Patent
Mirzaei et al.

(10) Patent No.: US 8,467,760 B2
(45) Date of Patent: *Jun. 18, 2013

(54) FREQUENCY TRANSLATED FILTERS FOR WIDEBAND APPLICATIONS

(75) Inventors: Ahmad Mirzaei, Costa Mesa, CA (US); Hooman Darabi, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 566 days.

This patent is subject to a terminal disclaimer.

(21) Appl. No.: 12/497,298

(22) Filed: Jul. 2, 2009

(65) Prior Publication Data

US 2011/0003569 A1 Jan. 6, 2011

(51) Int. Cl.
*H04B 1/18* (2006.01)
*H04B 1/10* (2006.01)

(52) U.S. Cl.
USPC ............ 455/293; 455/307; 455/311; 455/339

(58) Field of Classification Search
USPC ................ 455/280, 283, 292, 293, 296, 307, 455/311, 334, 338, 339
See application file for complete search history.

(56) References Cited

U.S. PATENT DOCUMENTS

| 5,434,541 | A | 7/1995 | Knoedl |
| 5,678,226 | A | 10/1997 | Li et al. |
| 6,016,170 | A | 1/2000 | Takayama et al. |
| 6,094,236 | A | 7/2000 | Abe et al. |
| 6,141,371 | A | 10/2000 | Holmes et al. |
| 6,512,408 | B2 * | 1/2003 | Lee et al. ...................... 327/359 |
| 6,954,625 | B2 | 10/2005 | Cowley |
| 7,248,844 | B2 | 7/2007 | Rofougaran |
| 7,555,273 | B2 | 6/2009 | Morche |
| 7,764,942 | B2 | 7/2010 | Bayruns |
| 7,809,349 | B1 | 10/2010 | Granger-Jones et al. |
| 8,285,241 | B2 | 10/2012 | Mirzaei et al. |
| 2003/0186669 | A1 * | 10/2003 | Yamawaki et al. ........... 455/323 |
| 2004/0110482 | A1 | 6/2004 | Chung |
| 2005/0024544 | A1 * | 2/2005 | Waight et al. ................. 348/731 |
| 2007/0121945 | A1 * | 5/2007 | Han et al. ..................... 380/263 |
| 2007/0287403 | A1 * | 12/2007 | Sjoland ........................ 455/326 |
| 2008/0014896 | A1 | 1/2008 | Zhuo et al. |

(Continued)

OTHER PUBLICATIONS

Darabi, "A Blocker Filtering Technique for SAW-Less Wireless Receivers," IEEE Journal of Solid-State Circuits, vol. 42, No. 12, pp. 2766-2773, Dec. 2007.

(Continued)

*Primary Examiner* — Nguyen Vo
(74) *Attorney, Agent, or Firm* — Sterne, Kessler, Goldstein & Fox P.L.L.C.

(57) ABSTRACT

Embodiments of a SAW-less RF receiver front-end that includes a frequency translated notch filter (FTNF) are presented. An FTNF includes a passive mixer and a baseband impedance. The baseband impedance includes capacitors that form a low-Q band-stop filter. The passive mixer is configured to translate the baseband impedance to a higher frequency. The translated baseband impedance forms a high-Q notch filter and is presented at the input of the FTNF. The FTNF can be fully integrated in CMOS IC technology (or others, e.g., Bipolar, BiCMOS, and SiGe) and applied in wireless receiver systems including EDGE/GSM, Wideband Code Division Multiple Access (WCDMA), Bluetooth, and wireless LANs (e.g., IEEE 802.11). In addition, embodiments of a generalized FTNF for wideband applications are presented.

26 Claims, 14 Drawing Sheets

U.S. PATENT DOCUMENTS

| | | |
|---|---|---|
| 2008/0083967 A1 | 4/2008 | Nakatani et al. |
| 2008/0175307 A1 | 7/2008 | Brunn et al. |
| 2009/0133252 A1 | 5/2009 | Drapkin et al. |
| 2009/0191833 A1 | 7/2009 | Kaczman et al. |
| 2010/0255791 A1 | 10/2010 | Vazny et al. |
| 2010/0267354 A1* | 10/2010 | Mirzaei et al. ............ 455/307 |
| 2010/0317308 A1 | 12/2010 | Mirzaei et al. |
| 2010/0317311 A1 | 12/2010 | Mirzaei et al. |
| 2011/0003572 A1 | 1/2011 | Mirzaei et al. |
| 2011/0092176 A1 | 4/2011 | Molnar et al. |

OTHER PUBLICATIONS

Mirzaei et al., "A Low-Power WCDMA Transmitter With an Integrated Notch Filter," IEEE Journal of Solid-State Circuits, vol. 43, No. 12, pp. 2868-2881, Dec. 2008.

Darabi, "A Blocker Filtering Technique for Wireless Receivers," International Solid-State Circuits Conference 2007, Session 4, RF Building Blocks, 4.4, pp. 84-86, Feb. 12, 2007.

* cited by examiner

FREQUENCY TRANSLATED FILTERS FOR WIDEBAND APPLICATIONS

FIELD OF THE INVENTION

This application relates generally to filters and, more specifically, to high quality factor (Q) filters.

BACKGROUND

There exist two commonly implemented front-end architectures in radio frequency (RF) receiver design; namely, the homodyne architecture and the heterodyne architecture. The homodyne architecture down-converts a desired channel directly from RF to baseband, whereas the heterodyne architecture down-converts a desired channel to one or more intermediate frequencies (IF) before down-conversion to baseband. In general, each of these front-end architectures typically employ an antenna to receive an RF signal, a band-pass filter to suppress out-of-band interferers in the received RF signal, a low noise amplifier (LNA) to provide gain to the filtered RF signal, and one or more down-conversion stages.

Each component in a receiver front-end contributes noise to the overall system. The noise of a component can be characterized by its noise factor (F), which is given by the ratio of the SNR at the input of the component to the SNR at the output of the component:

$$F_{COMPONENT} = SNR_{IN}/SNR_{OUT}$$

The noise of the overall receiver front-end increases from input to output as noise from successive components compound. In general, the overall noise factor of the receiver front-end is proportional to the sum of each component's noise factor divided by the cascaded gain of preceding components and is given by:

$$F_{TOTAL} = F_1 + \frac{F_{2-1}-1}{A_1} + \frac{F_{3-1}-1}{A_1 A_2} + \ldots + \frac{F_{n-1}-1}{A_1 A_2 \ldots A_{n-1}}$$

where $F_n$ and $A_n$ represent the noise factor and gain of the nth component in the receiver front-end, respectively. The above equation reveals that the noise factor ($F_1$) and gain ($A_1$) of the first gain component can have a dominant effect on the overall noise factor of the receiver front-end, since the noise contributed by each successive component is diminished by the cascaded gain of the components that precede it.

To provide adequate sensitivity, therefore, it is important to keep the noise factor ($F_1$) low and the gain ($A_1$) high of the first gain component in the receiver front-end. The sensitivity of the receiver front-end determines the minimum signal level that can be detected and is limited by the overall noise factor of the receiver front-end. Thus, in typical receiver designs the first gain component in the front-end is an LNA, which can provide high gain, while contributing low noise to the overall RF receiver.

LNAs provide relatively linear gain for small signal inputs. However, for sufficiently large input signals, LNAs can exhibit non-linear behavior in the form of gain compression; that is, for sufficiently large input signals, the gain of the LNA approaches zero. LNA gain compression is a common issue confronted in RF receiver design, since large out-of-band interferers referred to as blockers can accompany a comparatively weak desired signal in a received RF signal. For example, in the Global System for Mobile Communications (GSM) standard, a desired signal 3 dB above sensitivity (−102 dBm) can be accompanied by a 0 dBm blocker as close as 80 MHz away. If these large out-of-band interferers are not attenuated prior to reaching the LNA, they can reduce the average gain of the LNA. As noted above, a reduction in the gain provided by the LNA leads to an increase in the noise factor of the receiver front-end and a corresponding degradation in sensitivity.

Therefore, a band-pass filter is conventionally employed in the receiver front-end, before the LNA, to attenuate large out-of-band interferers. These filters are typically mechanically-resonant devices, such as surface acoustic wave (SAW) filters, that provide a high quality factor (Q) required by many of today's communication standards (e.g., GSM). The Q-factor of a tuned circuit, such as a band-pass filter, is the ratio of its resonant frequency (or center frequency) to its 3 dB frequency bandwidth. SAW filters are generally not amenable to monolithic integration on a semiconductor substrate with the RF receiver. However, SAW filters remain conventional in RF receiver design because of the limited Q-factor of silicon-based inductors.

Although SAW filters can provide excellent attenuation of large out-of-band interferers and accurate pass-band location, they have several associated disadvantages. First, these filters have an approximate insertion loss of 1-2 dB in their pass-band. This directly adds to the noise factor and degrades sensitivity of the RF receiver. Second, these filters invariably add cost and circuit board area, especially in multi-band applications where several of these filters can be required.

Therefore, there exists a need for an apparatus that provides adequate attenuation of large out-of-band interferers on a semiconductor substrate, while accommodating wideband applications

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will be described with reference to the accompanying drawings. The drawing in which an element first appears is typically indicated by the leftmost digit(s) in the corresponding reference number.

DETAILED DESCRIPTION

In the following description, numerous specific details are set forth in order to provide a thorough understanding of the invention. However, it will be apparent to those skilled in the art that the invention, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the invention.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

1. SAW-LESS RF RECEIVER FRONT-END

Figure 1A:
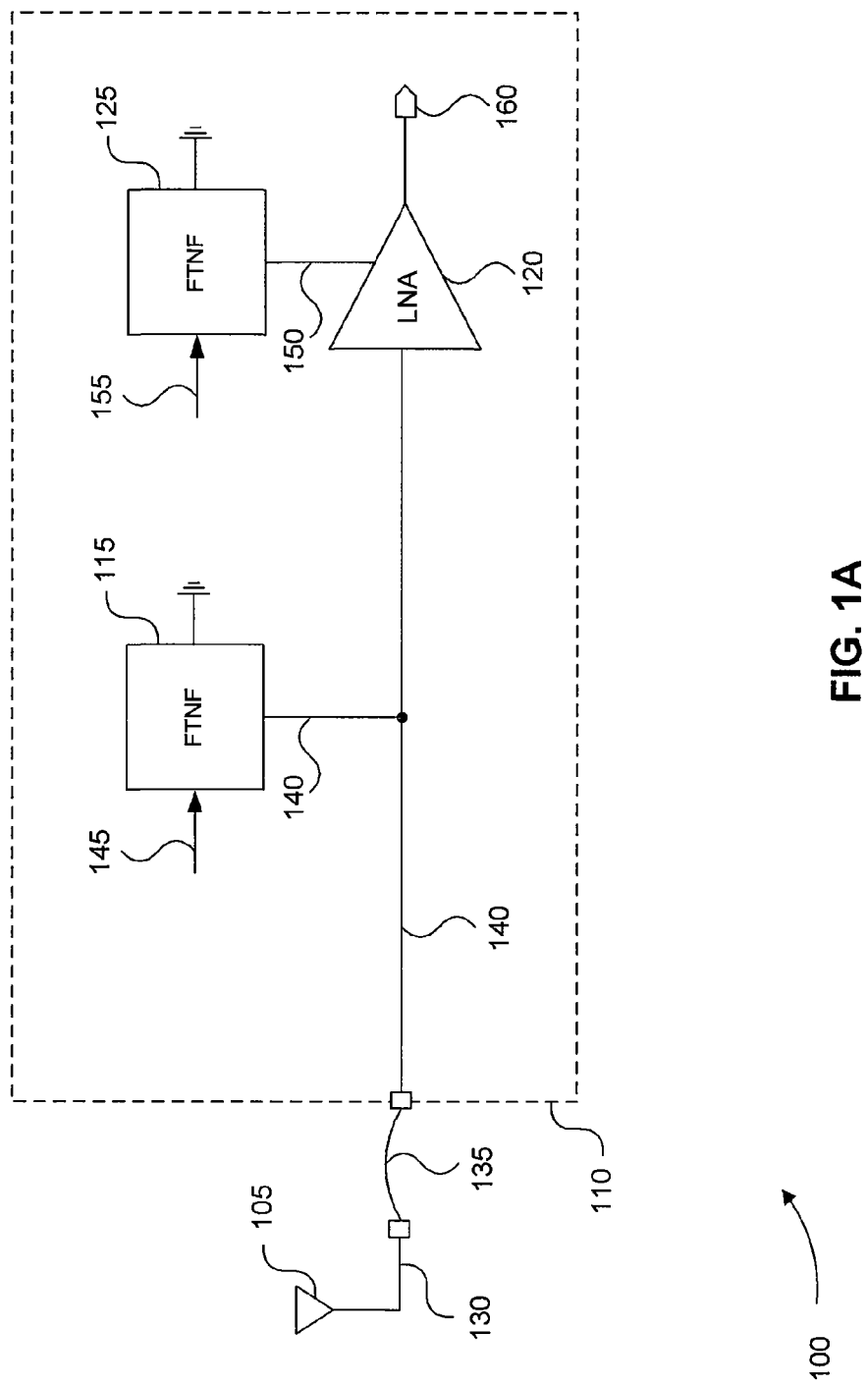
FIG. 1A illustrates an exemplary RF receiver front-end that provides for suppression of out-of-band interferers on a semiconductor substrate, according to embodiments of the present invention.

FIG. 1A illustrates an exemplary RF receiver front-end 100 that provides for suppression of out-of-band interferers on a semiconductor substrate, according to embodiments of the present invention. RF receiver front-end 100 includes an antenna 105, a semiconductor substrate 110, a first frequency translated notch filter (FTNF) 115, a low noise amplifier (LNA) 120, and a second FTNF 125.

RF receiver front-end 100 receives at antenna 105 an RF signal that includes a desired channel. In an embodiment, the desired channel is positioned within a frequency band defined by a particular communications standard. For example, the desired channel can be positioned within a frequency band defined by the GSM standard, such as the Global System for Mobile Communications 900 (GSM-900) band, the Digital Cellular System 1800 (DCS-1800) band, or the Personal Communications Services 1900 (PCS-1900) band. The RF signal is provided via antenna coupling 130 to bond wire 135. Bond wire 135 couples the RF signal to an input terminal or pin of semiconductor substrate 110. After reaching the input terminal of semiconductor substrate 110, the RF signal is coupled to single-ended RF signal path 140.

The RF signal is provided to FTNF 115, via single-ended RF signal path 140, to attenuate interferers outside the band containing the desired channel. FTNF 115 includes a passive mixer (not shown) and a baseband impedance (not shown) that forms a low-Q band-stop filter. The passive mixer is configured to translate the baseband impedance to a higher frequency by an amount substantially equal to the frequency of a 25% duty cycle local oscillator (LO) signal received at LO coupling 145. The translated impedance forms a high-Q notch filter coupled between the RF signal, received via single-ended RF signal path 140, and ground.

In general, a notch filter is a band-stop filter with a narrow stop-band (the "notch" of the filter represents the stop-band). Frequency components of a signal applied at the input of the notch filter that fall within the stop-band are substantially precluded from being passed through to the filter output. All other frequency components of the signal, outside the stop-band, are substantially passed through to the filter output. As illustrated in FIG. 1, the input of FTNF 115 is coupled to single-ended RF signal path 140 and the output of FTNF 115 is coupled to ground.

The notch presented by FTNF 115 can be tuned to (i.e., centered within) either the frequency band of the RF signal that contains the desired channel or to the desired channel itself. Specifically, the 25% duty cycle LO signal received at LO coupling 145 can be adjusted to have a frequency substantially equal to either the center frequency of the band containing the desired channel or to the center frequency of the desired channel itself. Moreover, the bandwidth of the notch presented by FTNF 115 can be designed to encompass either the band containing the desired channel or the desired channel itself. In this way, FTNF 115 can present a high-impedance path to ground for either the entire frequency band containing the desired channel or to the desired channel itself, and a low impedance path to ground for out-of-band interferers.

Since out-of-band interferers will not develop any substantial voltage across the impedance provided by FTNF 115, they will be attenuated. Frequency components within the notch of FTNF 115, however, will develop a substantial voltage across the impedance provided by FTNF 115 and, thus, will be provided to LNA 120 for further processing.

In conventional RF receiver front-ends, the RF signal is typically filtered by a high-Q RF filter (e.g., a SAW filter) prior to reaching the input terminal of semiconductor substrate 110. In general, the limited Q of silicon-based inductors has thus far prevented the practical integration of a high-Q RF filter on a semiconductor substrate, such as semiconductor substrate 110. FTNF 115 overcomes these previous limitations and provides one practical implementation of a high-Q RF filter for integration on a semiconductor substrate. The operation of FTNF 115 is further described in U.S. patent application Ser. No. 12/470,789, the disclosure of which is incorporated herein by reference.

After undergoing filtering by FTNF 115, LNA 120 receives the RF signal via single-ended RF signal path 140 and provides sufficient amplification to the desired channel of the RF signal to overcome the noise of subsequent stages. The amplified RF signal is provided at LNA output 160 for further processing (e.g., frequency conversion and baseband processing). LNA output 160 can be either single-ended or differential.

In an embodiment, FTNF 125 can be further utilized to attenuate any residual, out-of-band interferers that remain after initial filtering by FTNF 115. In an embodiment, FTNF 125 is coupled to the RF signal through an intermediary node between an input stage and a cascode stage of LNA 120.

In general, FTNF 125 is substantially similar to FTNF 115 and includes a passive mixer (not shown) and a baseband impedance (not shown) that forms a low-Q band-stop filter. The passive mixer is configured to translate the baseband impedance to a higher frequency by an amount substantially equal to the frequency of a 25% duty cycle local oscillator (LO) signal received at LO coupling 155. The translated impedance forms a high-Q notch filter coupled between the RF signal, received via single-ended coupling 150, and ground. In an embodiment, the LO signal received at LO coupling 155 is the same LO signal coupled to LO coupling 145.

Figure 1B:
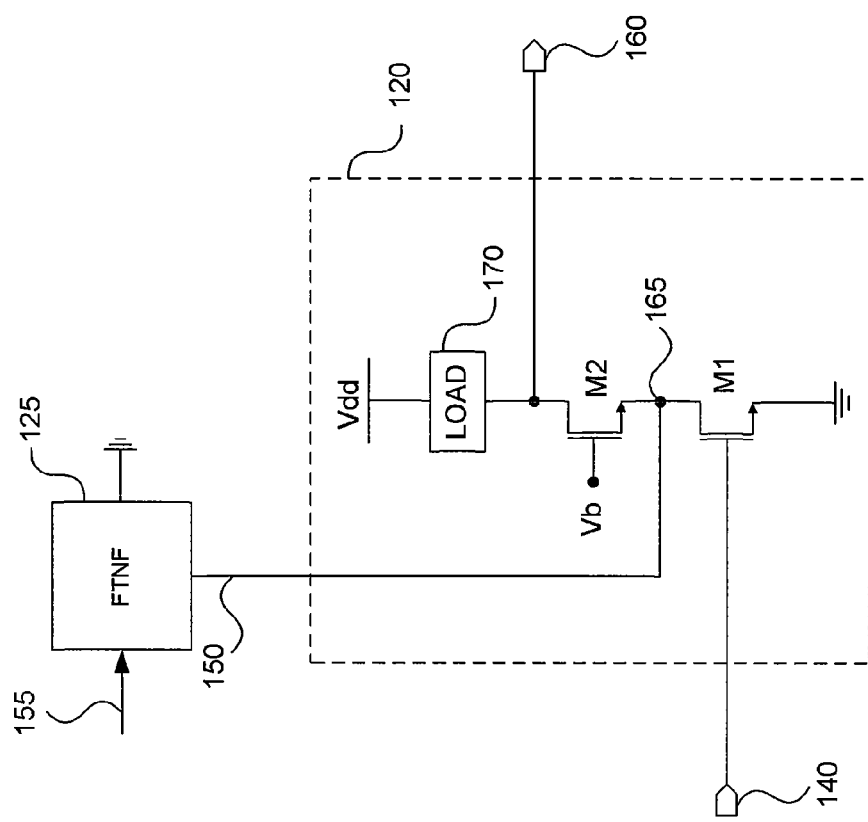
FIG. 1B illustrates an exemplary implementation of a single-ended LNA coupled to a single-ended FTNF, according to embodiments of the present invention.

FIG. 1B illustrates an exemplary implementation of LNA 120 as coupled to FTNF 125 in further detail, according to embodiments of the present invention. As illustrated in FIG. 1B, LNA 120 is implemented as a common source LNA and provides sufficient amplification to the desired channel to overcome the noise of subsequent stages.

The common-source implementation of LNA 120 includes a first field effect transistor (FET) M1 coupled at its gate to single-ended RF signal path 140. In an embodiment, single-ended RF signal path 140 can be coupled to the gate of M1 through an impedance, such as an inductor. The source of M1, although illustrated as being simply coupled to ground, can further be coupled through an impedance, such as an inductor, to ground. The drain of M1 is coupled to the source of a second FET M2 at a node 165. In addition, FTNF 125 is further coupled to node 165 via single-ended coupling 150. M2 is biased at its gate via bias voltage Vb. In an embodiment, M2 is used to maximize gain and provide reverse isolation. The drain of M2 is coupled through a load 170 to a supply voltage $V_{dd}$. Load 170 can include any one of a resistor, inductor, capacitor, or any combination thereof. An amplified version of the RF signal is provided at the drain of M2. The amplified version of the RF signal is provided at LNA output 160.

It should be noted that the common-source implementation of LNA 120 represents one exemplary single-ended LNA configuration. As will be appreciated by one of ordinary skill in the art, other single-ended LNA configurations can be used without departing from the scope and spirit of the present invention.

Figure 2A:
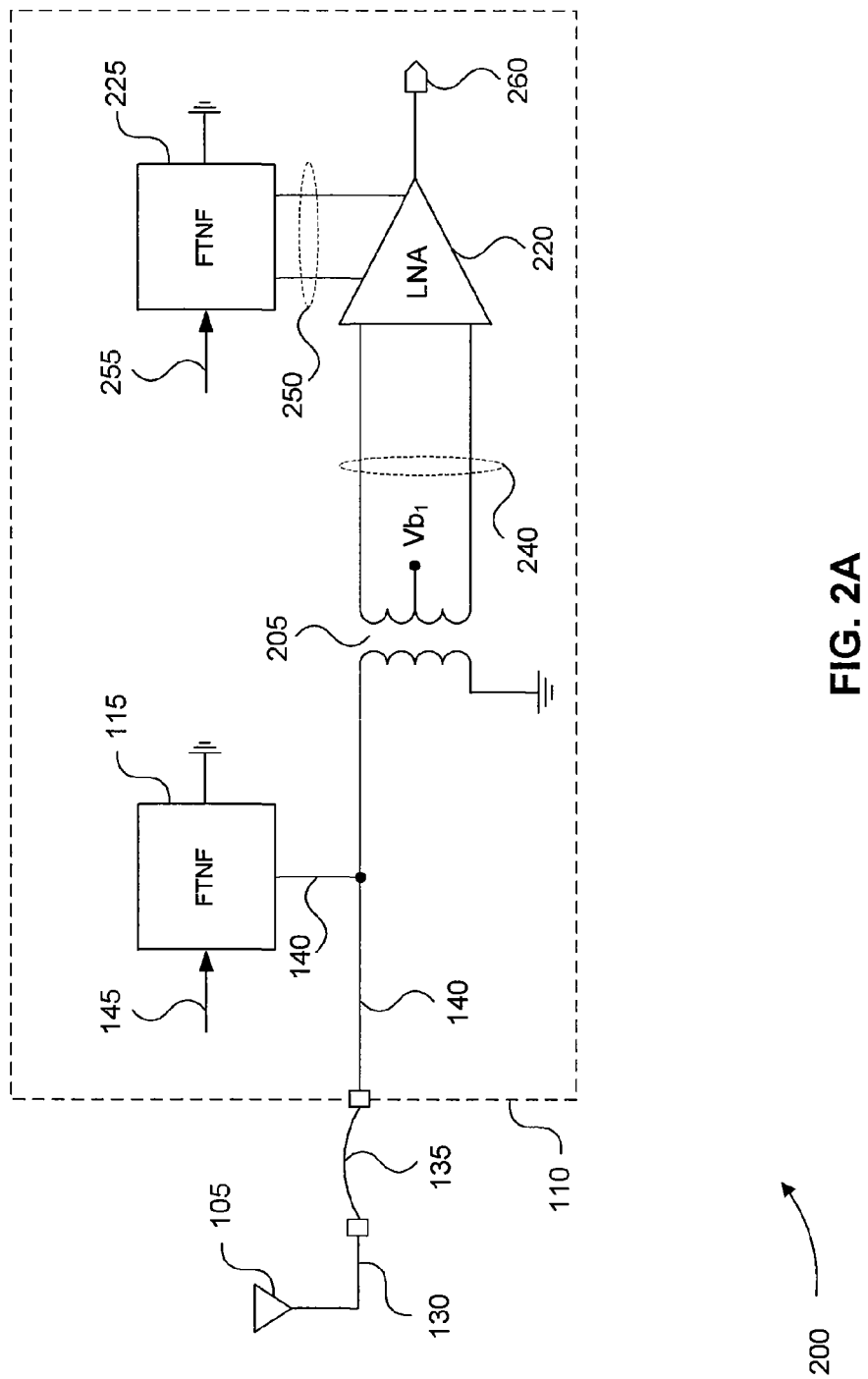
FIG. 2A illustrates an additional exemplary RF receiver front-end that provides for suppression of out-of-band interferers on a semiconductor substrate, according to embodiments of the present invention.

FIG. 2A illustrates a further exemplary RF receiver front-end 200 that provides for suppression of out-of-band interferers on a semiconductor substrate, according to embodiments of the present invention. RF receiver front-end 200 includes substantially the same structure as RF receiver front-end 100 illustrated in FIG. 1A. However, RF receiver front-end 200 further includes balun transformer 205 and replaces single-ended LNA 120 and single-ended FTNF 125 of FIG. 1A with a differential LNA 220 and a differential FTNF 225.

Balun transformer 205 receives the RF signal from single-ended RF signal path 140 and transforms the RF signal into a differential RF signal. The differential RF signal is coupled to a differential RF signal path 240 by balun transformer 205. In an embodiment, bias voltage $V_{b1}$ of balun transformer 205 is capacitively coupled to ground.

After undergoing filtering by FTNF 115 and transformation by balun transformer 205, LNA 220 receives the differential RF signal via differential RF signal path 240 and provides sufficient amplification to the desired channel of the RF signal to overcome the noise of subsequent stages. The amplified RF signal is provided at LNA output 260 for further processing (e.g., frequency conversion and baseband processing). LNA output 260 can be either single-ended or differential.

In an embodiment, differential FTNF 225 can be further utilized to attenuate any residual, out-of-band interferers that remain after initial filtering by FTNF 115. In an embodiment, differential FTNF 225 is coupled to the RF signal through differential, intermediary nodes between an input stage and a cascode stage of differential LNA 220.

In general, differential FTNF 225 is substantially similar to FTNF 125 and includes a passive mixer (not shown) and a baseband impedance (not shown) that forms a low-Q band-stop filter. The passive mixer is configured to translate the baseband impedance to a higher frequency by an amount substantially equal to the frequency of a 25% duty cycle local oscillator (LO) signal received at LO coupling 255. The translated impedance forms a high-Q notch filter coupled between the RF signal, received via differential coupling 250, and ground. In an embodiment, the LO signal received at LO coupling 255 is the same LO signal coupled to LO coupling 145.

Figure 2B:
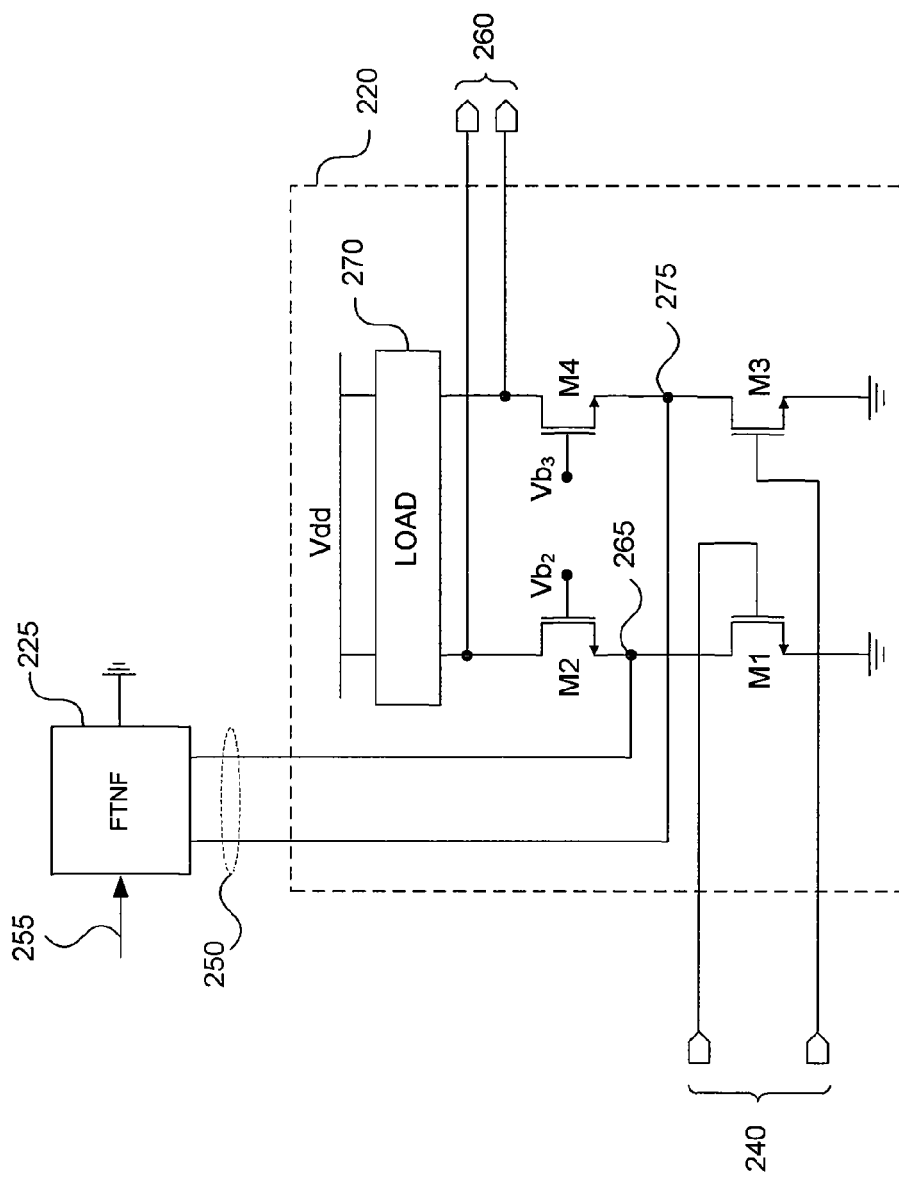
FIG. 2B illustrates an exemplary implementation of a differential LNA coupled to a differential FTNF, according to embodiments of the present invention.

FIG. 2B illustrates an exemplary implementation of LNA 220 as coupled to FTNF 225 in further detail, according to embodiments of the present invention. As illustrated in FIG. 2B, LNA 220 is implemented as a common source LNA and provides sufficient amplification to the desired channel to overcome the noise of subsequent stages.

The common-source implementation of LNA 220 includes a first field effect transistor (FET) M1 coupled at its gate to a positive-end of differential RF signal path 240. In an embodiment, the positive-end of differential RF signal path 240 can be coupled to the gate of M1 through an impedance, such as an inductor. The source of M1, although illustrated as being simply coupled to ground, can further be coupled through an impedance, such as an inductor, to ground. The drain of M1 is coupled to the source of a second FET M2 at a node 265. In addition, FTNF 225 is further coupled to node 265 via a positive-end of differential coupling 250. M2 is biased at its gate via bias voltage $Vb_2$. In an embodiment, M2 is used to maximize gain and provide reverse isolation. The drain of M2 is coupled through a load 270 to a supply voltage $V_{dd}$. Load 270 can include any one of a resistor, inductor, capacitor, or any combination thereof. An amplified version of the positive-end of the RF signal is provided at the drain of M2. The amplified version of the positive-end of the RF signal is provided at LNA output 260.

The common-source implementation of LNA 220 further includes a third FET M3 coupled at its gate to a negative-end of differential RF signal path 240. In an embodiment, the negative-end of differential RF signal path 240 can be coupled to the gate of M3 through an impedance, such as an inductor. The source of M3, although illustrated as being simply coupled to ground, can further be coupled through an impedance, such as an inductor, to ground. The drain of M3 is coupled to the source of a fourth FET M4 at a node 275. In addition, FTNF 225 is further coupled to node 275 via a negative-end of differential coupling 250. M4 is biased at its gate via bias voltage $Vb_3$. In an embodiment, M4 is used to maximize gain and provide reverse isolation. The drain of M4 is coupled through a load 270 to a supply voltage $V_{dd}$. Load 270 can include any one of a resistor, inductor, capacitor, or any combination thereof. An amplified version of the negative-end of the RF signal is provided at the drain of M4. The amplified version of the negative-end of the RF signal is provided at LNA output 260.

Figure 3:
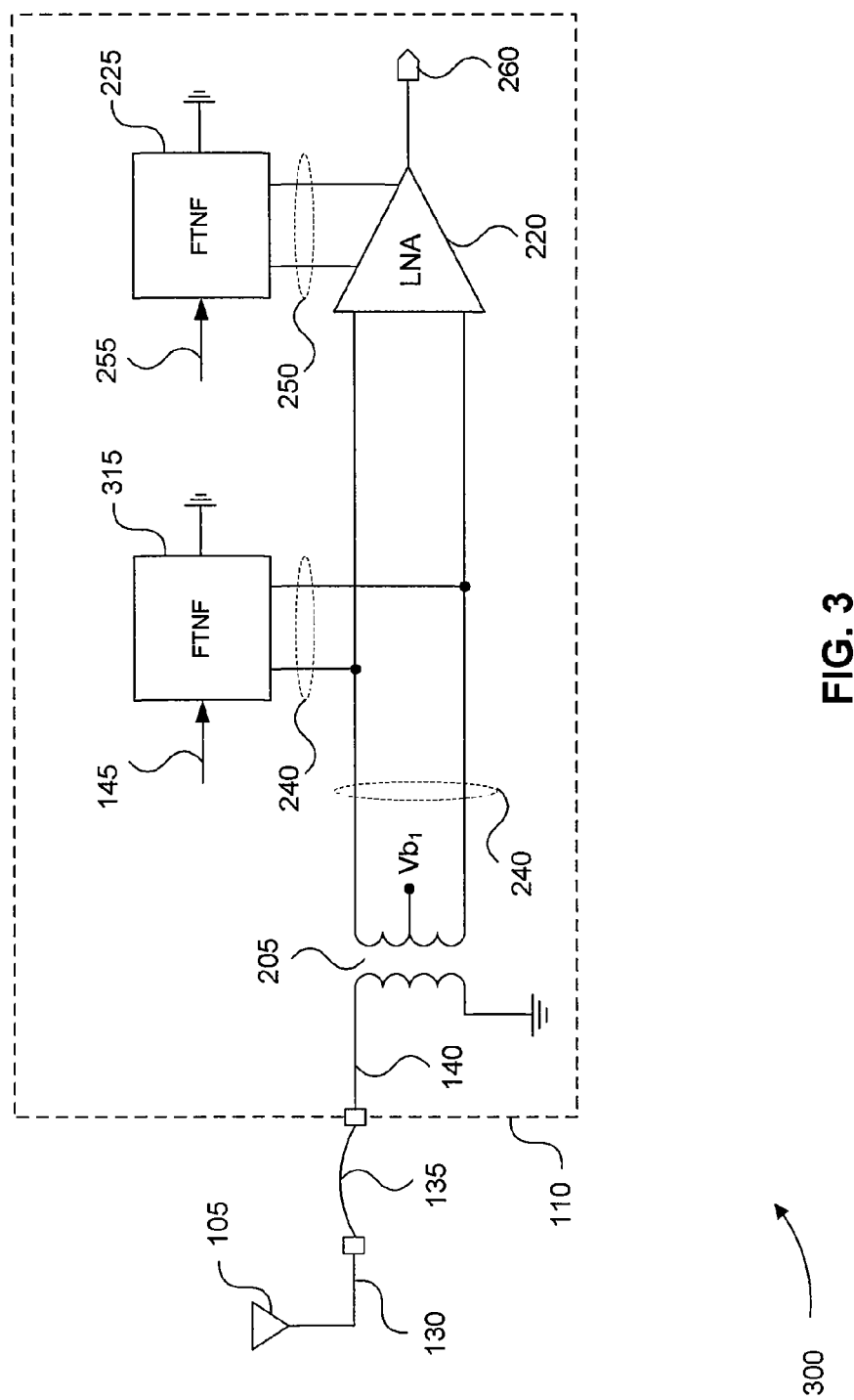
FIG. 3 illustrates yet another additional exemplary RF receiver front-end that provides for suppression of out-of-band interferers on a semiconductor substrate, according to embodiments of the present invention.

FIG. 3 illustrates yet another exemplary RF receiver front-end 300 that provides for suppression of out-of-band interferers on a semiconductor substrate, according to embodiments of the present invention. RF receiver front-end 300 includes substantially the same structure as RF receiver front-end 200 illustrated in FIG. 2A. However, RF receiver front-end 300 replaces single-ended FTNF 115 with a differential FTNF 315 coupled to differential RF signal path 240.

FIGS. 1A, 2A, and 3 provide exemplary configurations for SAW-less RF receiver front-ends. As will be appreciated by one of ordinary skill in the art based on the teachings herein, other configurations for SAW-less RF receiver front-ends are possible. These configurations are within the scope and spirit of the present invention.

2. FREQUENCY TRANSLATED NOTCH FILTER

2.1 Single-Ended Frequency Translated Notch Filter

Figure 4:
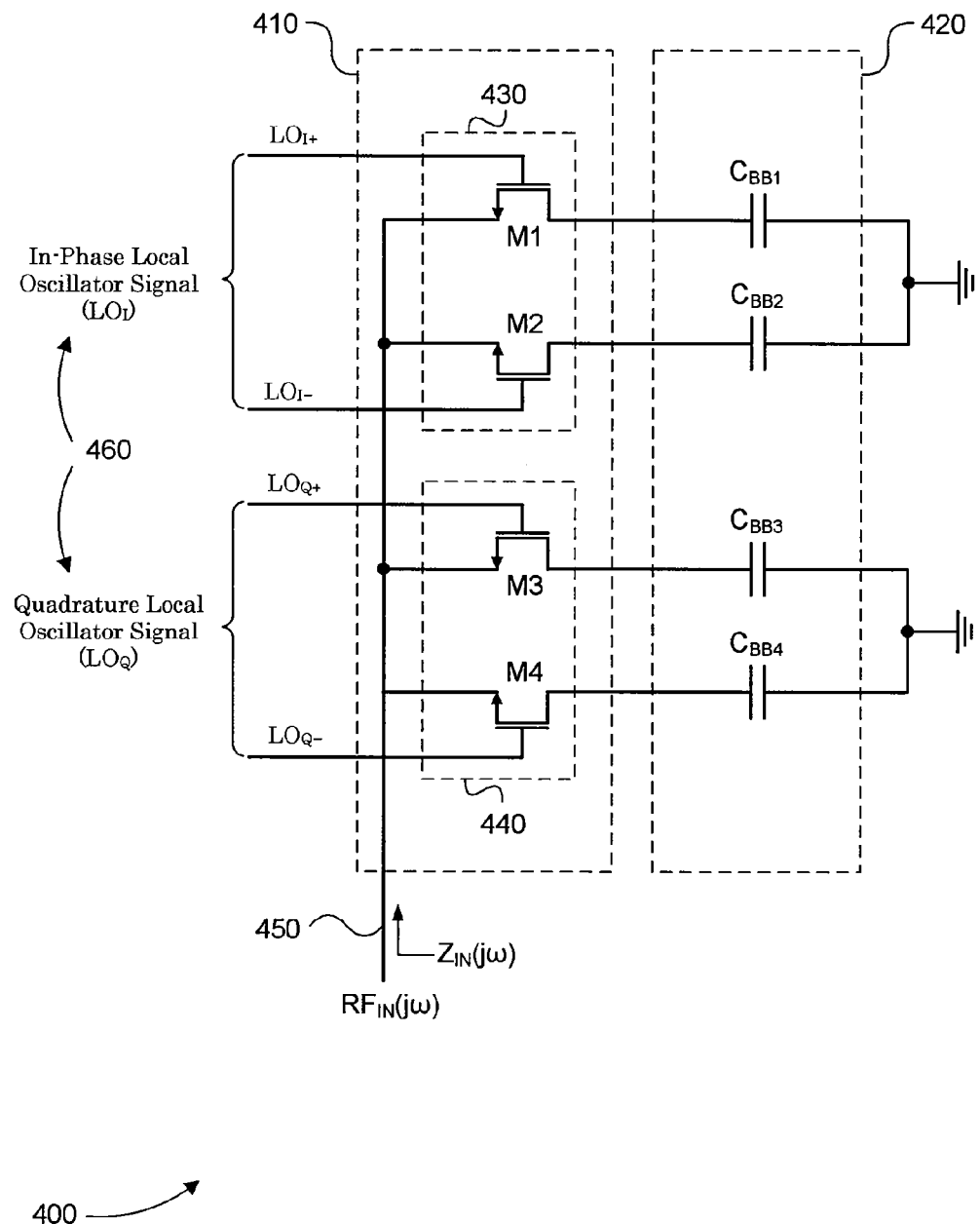
FIG. 4 illustrates an circuit-level implementation of a single-ended frequency translated notch filter (FTNF), according to embodiments of the present invention.

FIG. 4 illustrates an exemplary implementation of a single-ended frequency translated notch filter (FTNF) 400, according to embodiments of the present invention. In an embodiment, single-ended FTNF 115 illustrated in FIGS. 1A and 2A and single-ended FTNF 125 illustrated in FIGS. 1A and 1B have the same configuration as single-ended FTNF 400 illustrated in FIG. 4. FTNF 400 is single-ended in that it processes a single-ended RF signal ($RF_{IN}$) received at input 450. FTNF 400 includes a passive mixer 410 and a baseband impedance 420. Baseband impedance 420 includes capacitors $C_{BB1}$, $C_{BB2}$, $C_{BB3}$, and $C_{BB4}$ that form a low-Q band-stop filter. Passive mixer 410 is configured to translate baseband impedance 420 to a higher frequency. The translated baseband impedance ($Z_{IN}$) forms a high-Q band-stop filter (i.e., a notch filter) that is presented at input 450.

Passive mixer 410 includes single-balanced mixers 430 and 440. Single-balanced mixer 430 includes switching devices M1 and M2. Single-balanced mixer 440 includes switching devices M3 and M4. In an embodiment, switching devices M1, M2, M3, and M4 are metal-oxide semiconductor field effect transistors (MOSFETs). Specifically, switching devices M1, M2, M3, and M4 are n-channel MOSFETs (NMOS). However, as will be appreciated by one of ordinary skill in the art, switching devices M1, M2, M3, and M4 can be implemented using any suitable switching device, including p-channel MOSFETs (PMOS), bipolar junction transistors (BJTs) and junction gate field effect transistors (JFETs). In the embodiment of FIG. 4, switching devices M1, M2, M3, and M4 are operated substantially in their linear mode when ON.

Single-balanced mixer 430 receives a differential in-phase LO signal ($LO_I$) at LO coupling 460. The in-phase LO signal has a frequency of $\omega_{LO}$ and a duty-cycle substantially equal to 25%. The gate of switching device M1 is coupled to the positive in-phase LO signal ($LO_{I+}$), and the gate of switching device M2 is coupled to the negative in-phase LO signal ($LO_{I-}$). Because the two in-phase LO signals ($LO_{I+}$ and $LO_{I-}$) are substantially 180-degrees out of phase, switching devices M1 and M2 are switched ON and OFF at non-overlapping intervals at the frequency of the in-phase LO signal ($\omega_{LO}$). The non-overlapping switching of switching devices M1 and M2 at a frequency of $\omega_{LO}$ effectively multiplies the RF input signal ($RF_{IN}$), coupled to the sources of switching devices M1 and M2, by ±1. This effective multiplication results in frequency conversion of the RF input signal by the sum ($\omega_{RF}+\omega_{LO}$) and difference ($\omega_{RF}-\omega_{LO}$ or $\omega_{LO}-\omega_{RF}$) in frequency between the in-phase LO signal ($LO_I$) and the RF input signal. The frequency-converted, in-phase component of the RF input signal is provided differentially to baseband impedance 420.

Single-balanced mixer 440 receives a differential quadrature LO signal ($LO_Q$) at LO coupling 460. The quadrature LO signal has a frequency of $\omega_{LO}$ and a duty-cycle substantially equal to 25%. The gate of switching device M3 is coupled to the positive quadrature LO signal ($LO_{Q+}$), and the gate of switching device M4 is coupled to the negative quadrature LO signal ($LO_{Q-}$). Because the two quadrature LO signals ($LO_{Q+}$ and $LO_{Q-}$) are substantially 180-degrees out of phase, switching devices M3 and M4 are switched ON and OFF at non-overlapping intervals at the frequency of the quadrature LO signal ($\omega_{LO}$). The non-overlapping switching of switching devices M3 and M4 at a frequency of $\omega_{LO}$ effectively multiplies the RF input signal ($RF_{IN}$), coupled to the sources of switching devices M3 and M4, by ±1. This effective multiplication results in frequency conversion of the RF input signal by the sum ($\omega_{RF}+\omega_{LO}$) and difference ($\omega_{RF}-\omega_{LO}$ or $\omega_{LO}-\omega_{RF}$) in frequency between the quadrature LO signal ($LO_Q$) and the RF input signal. The frequency-converted, quadrature component of the RF input signal is provided differentially to baseband impedance 420.

The use of single-balanced mixers 430 and 440, effectively removes any DC offset component of the in-phase and quadrature LO signals, respectively. Removal of the DC component helps to reduce undesired feed-through of the RF input signal at the output of single-balanced mixers 430 and 440.

As noted above, baseband impedance 420 includes capacitors $C_{BB1}$, $C_{BB2}$, $C_{BB3}$, and $C_{BB4}$ that are respectively coupled between the drains of transistors M1-M4 and ground. In an embodiment, capacitors $C_{BB1}$, $C_{BB2}$, $C_{BB3}$, and $C_{BB4}$ are each substantially equivalent and their impedances are given by (ignoring parasitics):

$$Z_{BB}(j\omega) = \frac{1}{j\omega C}$$

where j is the imaginary unit, $\omega$ is the frequency of the signal applied across the capacitor, and C is the capacitance. As is readily apparent from the above, $Z_{BB}$ presents an extremely large impedance for DC signals. However, as the frequency of the applied signal moves in either the positive or negative direction, away from DC (i.e., 0-MHz), the impedance $Z_{BB}$ decreases. Thus, capacitors $C_{BB1}$, $C_{BB2}$, $C_{BB3}$, and $C_{BB4}$, effectively form a low-Q band-stop filter centered at baseband.

Since the impedance of capacitors $C_{BB1}$, $C_{BB2}$, $C_{BB3}$, and $C_{BB4}$ varies with the frequency of the signal applied across their terminals, it follows that the frequency conversion of the RF signal by passive mixer 410 alters the impedance seen by the RF signal at input 450. Specifically, the impedance of capacitors $C_{BB1}$, $C_{BB2}$, $C_{BB3}$, and $C_{BB4}$ will each appear translated by $\pm\omega_{LO}$ as seen by the RF signal at input 450; that is, the low-Q band-stop filter formed by baseband impedance 420 is substantially translated by $\pm\omega_{LO}$, becoming a high-Q band-stop filter presented at input 450. A high-Q band-stop filter is commonly referred to as a notch filter.

It can be shown that the translated baseband impedance ($Z_{IN}$) is substantially given by:

$$Z_{IN}(j\omega_{RF}) = R_{SW} + \frac{4}{\pi^2} \frac{j\omega_{RF}}{C_{BB}\{(j\omega_{RF})^2 + \omega_{LO}^2\}}$$

where $\omega_{RF}$ is the frequency of the RF signal received at input 450, $\omega_{LO}$ is the frequency of the LO signal received at LO coupling 460, and $R_{SW}$ is the switch resistance of switching devices M1-M4.

In an embodiment, $Z_{IN}$ is determined such that input 450 presents a high-impedance path to ground for frequency components of the RF signal within a desired frequency band and a low-impedance path to ground for frequency components of the RF signal outside the desired frequency band. The high-impedance (i.e., the notch) effectively precludes frequency components of the RF signal that are within the desired frequency band from being attenuated. Conversely, the low-impedance effectively allows frequency components of the RF signal outside the desired frequency band to be attenuated. In other words, frequency components of the RF signal outside the desired frequency band are filtered. The desired frequency band can be taken as an output at input 450, because the undesired frequency components have been shunted to ground.

Low-Q capacitive impedances, such as $C_{BB1}$, $C_{BB2}$, $C_{BB3}$, and $C_{BB4}$, are readily capable of monolithic integration on a common semiconductor substrate together with passive mixer 410. Therefore, FTNF 400 provides a suitable notch filter implementation for integration on a semiconductor substrate, such as semiconductor substrate 110 of FIG. 1A.

It should be emphasized that FTNF 400 can be fully integrated in CMOS IC technology (or others, e.g., Bipolar, BiCMOS, and SiGe) and applied in wireless receiver systems including GSM, WCDMA, Bluetooth, and wireless LANs (e.g., IEEE 802.11).

2.2 Differential Frequency Translated Notch Filter

Figure 5:
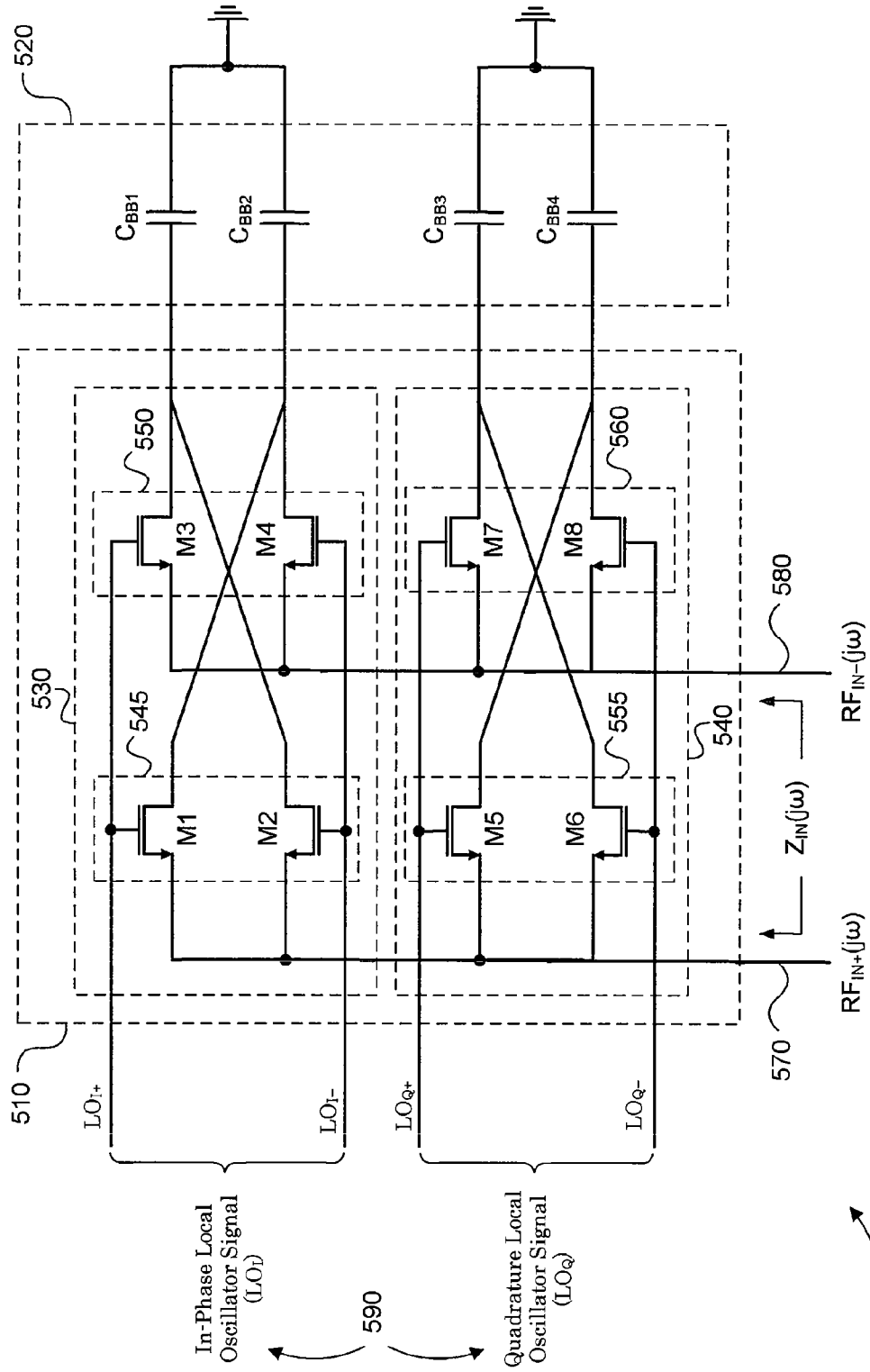
FIG. 5 illustrates an circuit-level implementation of a differential frequency translated notch filter (FTNF), according to embodiments of the present invention.

FIG. 5 illustrates an exemplary implementation of a differential frequency translated notch filter (FTNF) 500, according to embodiments of the present invention. In an embodiment, differential FTNF 225 illustrated in FIGS. 2A, 2B, and 3, and differential FTNF 315 illustrated in FIG. 3, have the same configuration as differential FTNF 500 illustrated in FIG. 5.

FTNF 500 is differential in that it processes a differential RF signal ($RF_{IN+}$ and $RF_{IN-}$) received at differential input pair 570 and 580. FTNF 500 includes a passive mixer 510 and a baseband impedance 520. Baseband impedance 520 includes capacitors $C_{BB1}$, $C_{BB2}$, $C_{BB3}$, and $C_{BB4}$ that form a low-Q band-stop filter. Passive mixer 510 is configured to translate baseband impedance 520 to a higher frequency. The translated baseband impedance ($Z_{IN}$) forms a high-Q band-stop filter (i.e., a notch filter) that is presented at differential input pair 570 and 580.

Passive mixer 510 includes double-balanced mixers 530 and 540. Double-balanced mixer 530 includes switching devices M1, M2, M3, and M4. Double-balanced mixer 540 includes switching devices M5, M6, M7, and M8. In an embodiment, switching devices M1-M8 are metal-oxide semiconductor field effect transistors (MOSFETs). Specifically, switching devices M1-M8 are n-channel MOSFETs (NMOS). However, as will be appreciated by one of ordinary skill in the art, switching devices M1-M8 can be implemented using any suitable switching device, including p-channel MOSFETs (PMOS), bipolar junction transistors (BJTs) and junction gate field effect transistors (JFETs). In the embodiment of FIG. 2, switching devices M1-M8 are operated substantially in their linear mode when ON.

Double-balanced mixer 530 receives a differential, in-phase LO signal ($LO_I$) at LO coupling 590. The in-phase LO signal has a frequency of $\omega_{LO}$ and a duty-cycle substantially equal to 25%. Double-balanced mixer 530 is essentially formed from two single-balanced mixers 545 and 550. The gates of switching devices M1 and M3 are coupled to the positive in-phase LO signal ($LO_{I+}$), and the gates of switching devices M2 and M4 are coupled to the negative in-phase LO signal ($LO_{I-}$). Because the two in-phase LO signals ($LO_{I+}$ and $LO_{I-}$) are substantially 180-degrees out of phase, switching device pair M1 and M2 and switching device pair M3 and M4 are switched ON and OFF at non-overlapping intervals at the frequency of the in-phase LO signal ($\omega_{LO}$). The non-overlapping switching at a frequency of $\omega_{LO}$ effectively multiplies the positive RF signal ($RF_{IN+}$), coupled to the sources of switching devices M1 and M2, and the negative RF signal ($RF_{IN-}$), coupled to the sources of switching devices M3 and M4, by ±1. This effective multiplication results in frequency conversion of the differential RF signal by the sum ($\omega_{RF}+\omega_{LO}$) and difference ($\omega_{RF}-\omega_{LO}$ or $\omega_{LO}-\omega_{RF}$) in frequency between the in-phase LO signal ($LO_I$) and the differential RF signal. The frequency-converted in-phase component of the RF signal is provided differentially to baseband impedance 520.

Double-balanced mixer 540 receives a differential, quadrature LO signal ($LO_Q$) at LO coupling 590. The quadrature LO signal has a frequency of $\omega_{LO}$ and a duty-cycle substantially equal to 25%. Double-balanced mixer 540 is essentially formed from two single-balanced mixers 555 and 560. The gates of switching devices M5 and M7 are coupled to the positive quadrature LO signal ($LO_{Q+}$), and the gates of switching devices M6 and M8 are coupled to the negative quadrature LO signal ($LO_{Q-}$). Because the two quadrature LO signals ($LO_{Q+}$ and $LO_{Q-}$) are substantially 180-degrees out of phase, switching device pair M5 and M6 and switching device pair M7 and M8 are switched ON and OFF at non-overlapping intervals at the frequency of the quadrature LO signal ($\Omega_{LO}$). The non-overlapping switching at a frequency of $\omega_{LO}$ effectively multiplies the positive RF signal ($RF_{IN+}$), coupled to the sources of switching devices M5 and M6, and the negative RF signal ($RF_{IN-}$), coupled to the sources of switching devices M7 and M8, by ±1. This effective multiplication results in frequency conversion of the differential RF signal by the sum ($\omega_{RF}+\omega_{LO}$) and difference ($\omega_{RF}-\omega_{LO}$ or $\omega_{LO}-\omega_{RF}$) in frequency between the in-phase LO signal ($LO_I$) and the differential RF signal. The frequency-converted quadrature component of the RF signal is provided differentially to baseband impedance 520.

The use of double-balanced mixers 530 and 540 effectively removes any DC offset component of the in-phase and quadrature LO signals, as well as any DC offset component of the differential RF signal. Removal of the DC components helps to reduce undesired feed-through of the RF signal and the LO signal at the output of double-balanced mixers 530 and 540.

As noted above, baseband impedance 520 includes capacitors $C_{BB1}$, $C_{BB2}$, $C_{BB3}$, and $C_{BB4}$ that are respectively coupled between the drains of switching devices M1-M8 and ground. In an embodiment, capacitors $C_{BB1}$, $C_{BB2}$, $C_{BB3}$, and $C_{BB4}$ are each substantially equivalent and their impedances are given by (ignoring parasitics):

$$Z_{BB}(j\omega) = \frac{1}{j\omega C}$$

where j is the imaginary unit, ω is the frequency of the signal applied across the capacitor, and C is the capacitance. As is readily apparent from the above $Z_{BB}$ presents an extremely large impedance for DC signals. However, as the frequency of the applied signal moves in either the positive or negative direction, away from DC (i.e., 0-MHz), the impedance $Z_{BB}$ decreases. Thus, capacitors $C_{BB1}$, $C_{BB2}$, $C_{BB3}$, and $C_{BB4}$, effectively form a low-Q band-stop filter centered at baseband.

Since the impedance of capacitors $C_{BB1}$, $C_{BB2}$, $C_{BB3}$, and $C_{BB4}$ varies with the frequency of the signal applied across their terminals, it follows that the frequency conversion of the differential RF signal by passive mixer 510 alters the impedance seen by the differential RF signal at differential input pair 570 and 580. Specifically, the impedance of capacitors $C_{BB1}$, $C_{BB2}$, $C_{BB3}$, and $C_{BB4}$ will each appear translated by $\pm\omega_{LO}$ as seen by the differential RF signal at differential input pair 570 and 580; that is, the low-Q band-stop filter formed by baseband impedance 520 is substantially translated by $\pm\omega_{LO}$, becoming a high-Q band-stop filter presented at differential input pair 570 and 580. A high-Q band-stop filter is commonly referred to as a notch filter.

It can be shown that the translated baseband impedance ($Z_{IN}$) is substantially given by:

$$Z_{IN}(j\omega_{RF}) = R_{SW} + \frac{4}{\pi^2} \frac{j\omega_{RF}}{C_{BB}\{(j\omega_{RF})^2 + \omega_{LO}^2\}}$$

where $\omega_{RF}$ is the frequency of the differential RF signal received at differential input pair 570 and 580, $\omega_{LO}$ is the frequency of the LO signal received at LO coupling 590, and $R_{SW}$ is the switch resistance of switching devices M1-M8.

In an embodiment, $Z_{IN}$ is determined such that differential input pair 570 and 580 presents a high-impedance path to ground for frequency components of the differential RF signal within a desired frequency band and a low-impedance path to ground for frequency components of the differential RF signal outside the desired frequency band. The high-impedance (i.e., the notch) effectively precludes frequency components of the differential RF signal that are within the desired frequency band from being attenuated. Conversely, the low-impedance effectively allows frequency components of the differential RF signal outside the desired frequency band to be attenuated. In other words, frequency components of the differential RF signal outside the desired frequency band are filtered. The desired frequency band can be taken as an output at differential input pair 570 and 580, because the undesired frequency components have been shunted to ground.

Low-Q capacitive impedances, such as $C_{BB1}$, $C_{BB2}$, $C_{BB3}$, and $C_{BB4}$, are readily capable of monolithic integration on a common semiconductor substrate together with passive mixer 510. Therefore, FTNF 500 provides a suitable notch filter implementation for integration on a semiconductor substrate, such as semiconductor substrate 110 of FIG. 1A.

It should be emphasized that FTNF 500 can be fully integrated in CMOS IC technology (or others, e.g., Bipolar, BiCMOS, and SiGe) and applied in wireless receiver systems including GSM, WCDMA, Bluetooth, and wireless LANs (e.g., IEEE 802.11).

2.3 Magnitude and Phase Relationship

Figure 6:
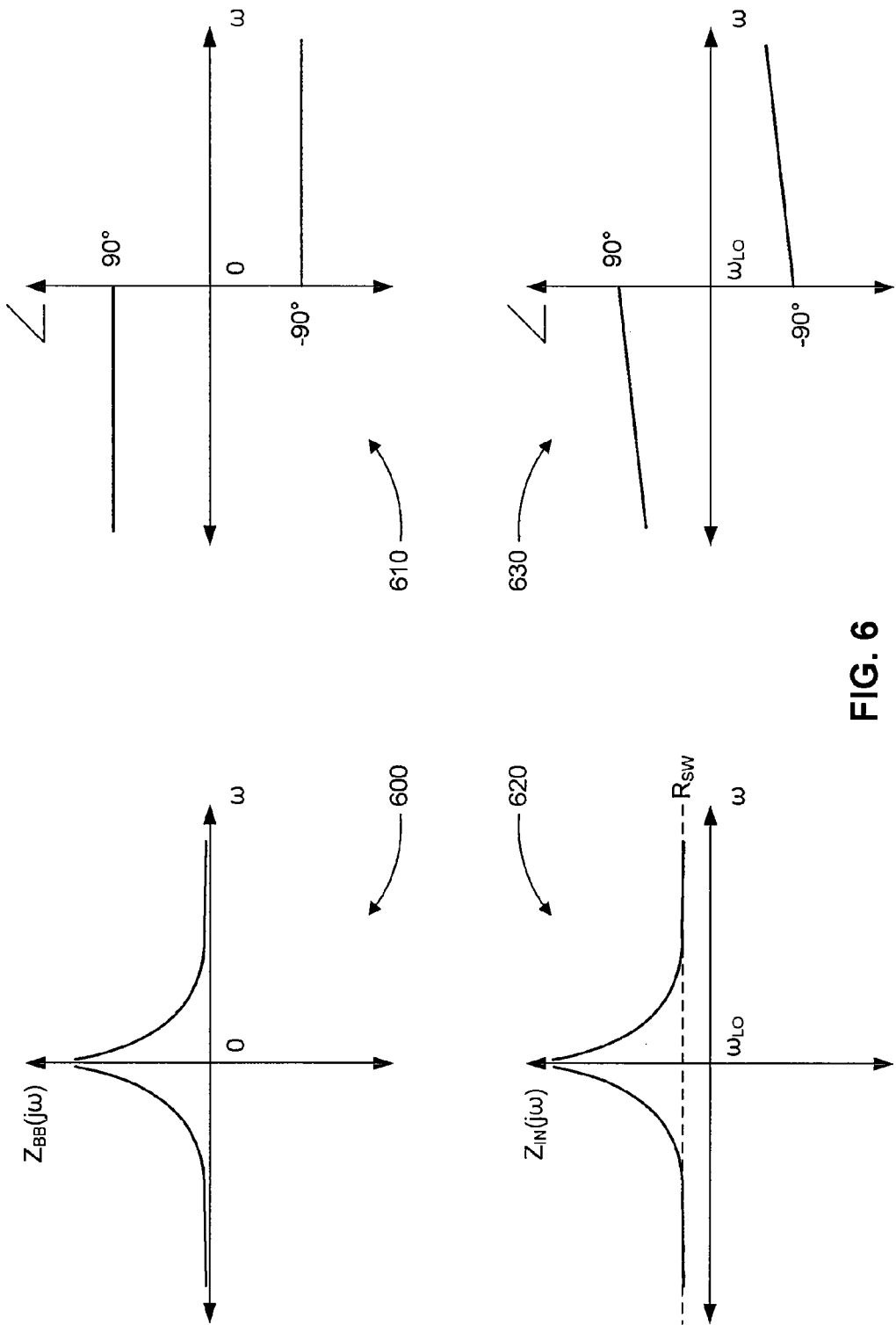
FIG. 6 illustrates the magnitude and phase relationship of the baseband impedance ($Z_{BB}$) and the translated baseband impedance ($Z_{IN}$) of the FTNF presented in FIG. 2, according to embodiments of the present invention.

FIG. 6 illustrates the magnitude and phase relationship of baseband impedances 420 ($Z_{BB}$) and 520 ($Z_{BB}$) and the translated baseband impedance ($Z_{IN}$) of FIGS. 5 and 6, according to embodiments of the present invention. Baseband impedances 420 and 520 have a frequency versus magnitude response 600 and a frequency versus phase response 610. For DC signals, baseband impedances 420 ($Z_{BB}$) and 520 ($Z_{BB}$) present an extremely large impedance. However, as the frequency of the applied signal moves in either the positive or negative direction, away from DC (i.e., 0-MHz), the impedance $Z_{BB}$ decreases. Thus, $Z_{BB}$ effectively forms a low-Q band-stop filter centered at baseband.

Frequency translated baseband impedance ($Z_{IN}$) has a frequency versus magnitude response 620 and a frequency versus phase response 630. The frequency versus magnitude response 630 clearly illustrates that the baseband impedance ($Z_{BB}$) has been substantially translated by $\omega_{LO}$ (only positive frequencies are illustrated in 620). For an applied signal at or near $\omega_{LO}$, $Z_{IN}$ presents an extremely large impedance. However, as the frequency of the applied signal moves in either the positive or negative direction, away from $\omega_{LO}$, the impedance $Z_{IN}$ quickly decreases to substantially the switch resistance $R_{SW}$ of switching devices M1-M4 of FIG. 4 or M1-M8 of FIG. 5. Thus, $Z_{IN}$ effectively forms a high-Q band-stop filter (i.e., a notch filter) centered at $\omega_{LO}$.

2.4 Local Oscillator Signals

Figure 7:
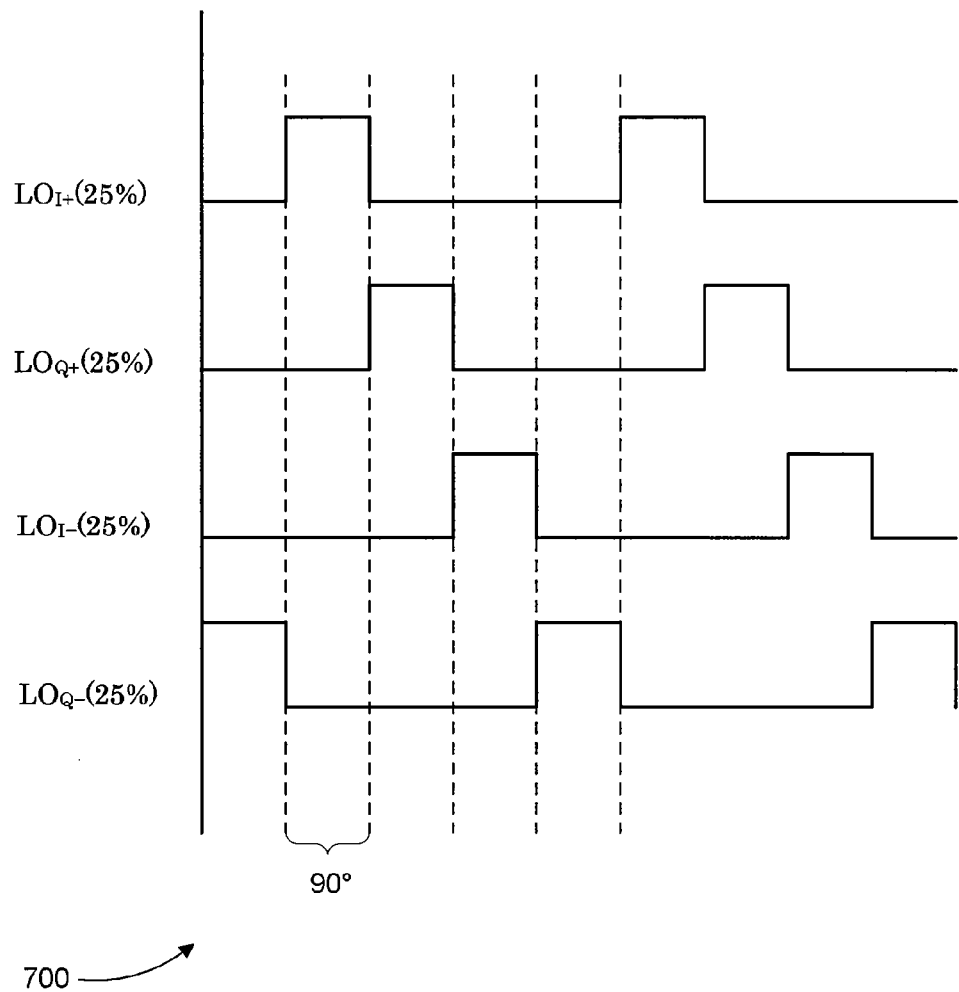
FIG. 7 illustrates a waveform diagram of exemplary LO signals for use by the passive mixer illustrated in FIG. 2, according to embodiments of the present invention.

FIG. 7 illustrates a waveform diagram of exemplary LO signals 700 for use by passive mixer 410 of FIG. 4 and 510 of FIG. 5, according to embodiments of the present invention. LO signals 700 include two differential phases of an LO signal; namely, an in-phase LO signal ($LO_{I+}$ and $LO_{I-}$) and a quadrature LO signal ($LO_{Q+}$ and $LO_{Q-}$). The positive in-phase LO signal ($LO_{I+}$) has a phase shift of substantially 90-degrees relative to the positive quadrature LO signal ($LO_{Q+}$), and the negative in-phase LO signal ($LO_{I-}$) has a phase shift of substantially 90-degrees relative to the negative quadrature LO signal ($LO_{Q-}$). The positive and negative ends of the differential signals $LO_I$ and $LO_Q$ have a phase shift of substantially 180-degrees relative to each other.

LO signals 700 each have a duty cycle substantially equal to 25%. The 25% duty cycle of LO signals 700 helps to suppress undesired images of the RF signal, received at input 450 in FIG. 4 and differential input pair 570 and 580 in FIG. 5, from occurring at the output of passive mixers 410 and 510. In general, the duty cycles of LO signals 700 can be greater than or less than 25%, provided that adequate image suppression is still achieved.

3. FREQUENCY TRANSLATED NOTCH FILTER FOR WIDEBAND APPLICATIONS

A mixer typically uses an LO signal to down-convert or up-convert an input signal. For example, as illustrated in FIG. 4, passive mixer 410 is configured to down-convert the RF signal ($RF_{IN}$) received at input 450 using the LO signals received at LO coupling 460. The LO signals received at LO coupling 460 approximate a square waveform. Unlike a single-tone sinusoidal waveform, a square waveform contains harmonics at specific multiples of the fundamental frequency of the LO signal (i.e., $\omega_{LO}$). Consequently, the output signal generated by a mixer using a square waveform as an LO signal can contain harmonics related to the LO frequency. Specifically, during down-conversion, the harmonics of the LO signal can cause RF input signals at multiples of the LO frequency to directly interfere with each other in a resulting baseband or IF signal.

In general, the implementations of FTNF 400, illustrated in FIG. 4, and FTNF 500, illustrated in FIG. 5, provide viable implementations for use within many RF receiver designs. However, for wideband RF receivers the higher-order harmonic effects that result from the passive mixers of FTNF 400 and 500 can cause significant interference with a desired portion of the RF signal.

Figure 8:
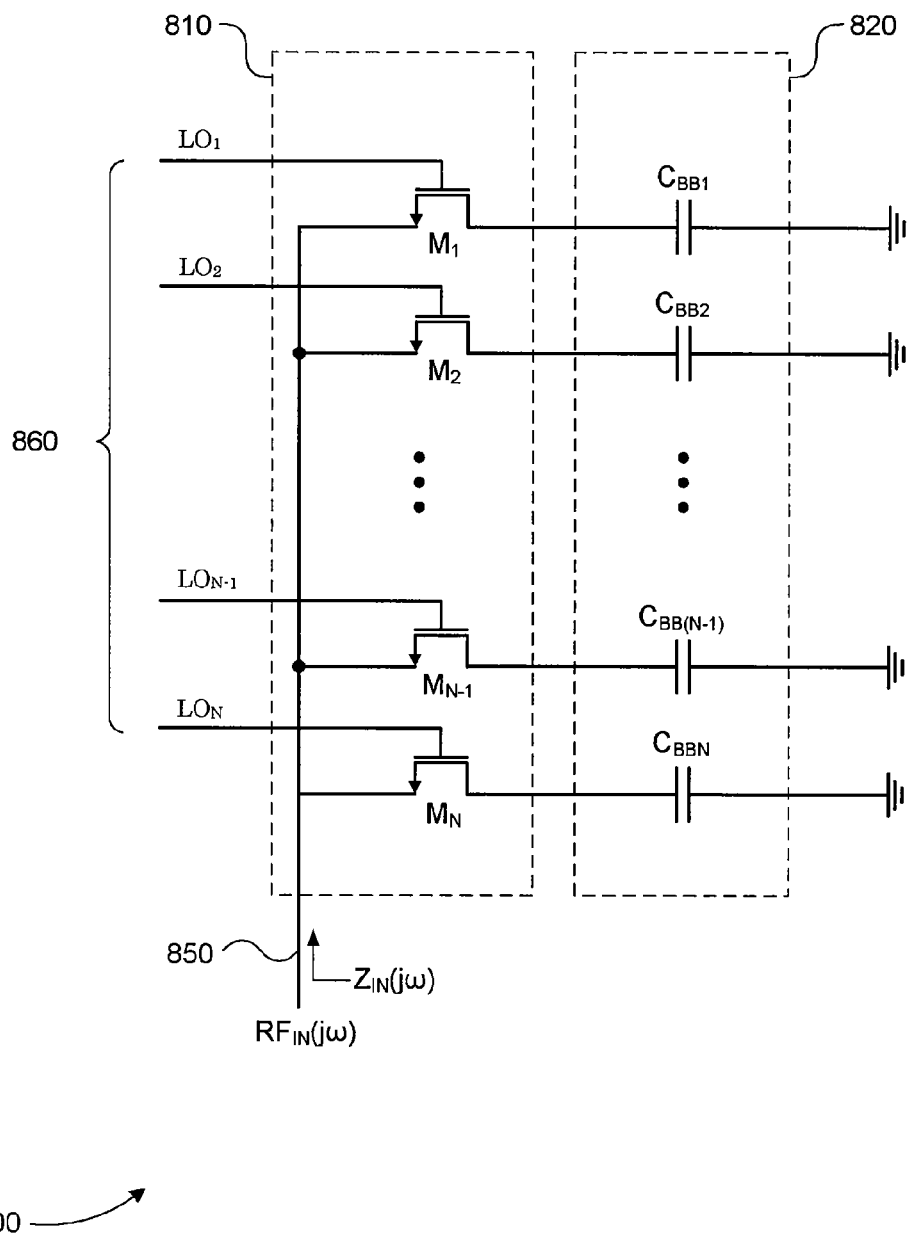
FIG. 8 illustrates a generalized, single-ended FTNF that can be designed for use in wideband RF receivers, according to embodiments of the present invention.

FIG. 8, described below, provides for a generalized FTNF structure that can be designed to limit interference caused by higher-order harmonic effects. Specifically, the generalized FNTF structure of FIG. 8 can be designed based on the range of frequencies in an RF signal that contains desired information. For example, the generalized FTNF structure of FIG. 8 can be designed to provide suitable implementations, having limited interference from higher-order harmonic effects, for wideband RF receivers such as ultra-wideband (UWB) receivers and TV receivers.

As illustrated in FIG. 8, FTNF 800 is single-ended and processes a single-ended RF signal ($RF_{IN}$) received at input 850. FTNF 800 includes a passive mixer 810 and a baseband impedance 820. Baseband impedance 820 includes N capacitors, $C_{BB1}$-$C_{BBN}$, that form a low-Q band-stop filter. Passive mixer 810 is configured to translate baseband impedance 820 to a higher frequency. Specifically, passive mixer 810 is configured to translate baseband impedance 820 to a higher frequency substantially equal to the fundamental frequency $\omega_{LO}$ of LO signals 860 received by passive mixer 810. The translated baseband impedance ($Z_{IN}$) forms a high-Q band-stop filter (i.e., a notch filter) that is presented at input 850.

In general, FTNF 800 has substantially the same structure as FTNF 400 illustrated in FIG. 4 and operates in substantially the same manner. However, FTNF 800 represents a more generalized structure. Specifically, FTNF 800 has been generalized to have N frequency conversion branches. Each frequency conversion branch includes an NMOS device coupled at its gate to a respective one of LO signals 860, at its source to the RF signal ($RF_{IN}$), and at its drain to a respective one of the capacitors $C_{BB1}$-$C_{BBN}$. For example, the first frequency conversion branch illustrated in FIG. 8 includes NMOS device M1, which is coupled at its gate to LO signal $LO_I$, at its source to the RF signal ($RF_{IN}$), and at its drain to capacitor $C_{BB1}$.

As will be appreciated by one of ordinary skill in the art, switching devices $M_1$-$M_N$ are not limited to NMOS devices and can be implemented using any suitable switching device, including PMOS, BJTs, and JFETs, to name a few.

The NMOS devices $M_1$-$M_N$ are switched ON and OFF at a rate substantially equal to the fundamental frequency $\omega_{LO}$ of LO signals 860. The switching of NMOS devices M1-$M_N$ effectively multiplies the RF signal, coupled to the sources of switching devices $M_1$-$M_N$, by each LO signal, $LO_I$-$LO_N$. This effective multiplication results in frequency conversion of the RF input signal by the sum ($\omega_{RF}+\omega_{LO}$) and difference ($\omega_{RF}-\omega_{LO}$ or $\omega_{LO}-\omega_{RF}$) in frequency between LO signals 860 and the RF input signal. The frequency-converted RF input signals are each provided to baseband impedance 820 via the drains of NMOS devices $M_1$-$M_N$.

As noted above, baseband impedance 820 includes capacitors $C_{BB1}$-$C_{BBN}$ that are respectively coupled between the drains of transistors $M_I$-$M_N$ and ground. In an embodiment, capacitors $C_{BB1}$-$C_{BBN}$ are each substantially equivalent and their impedances are given by (ignoring parasitics):

$$Z_{BB}(j\omega) = \frac{1}{j\omega C}$$

where j is the imaginary unit, $\omega$ is the frequency of the signal applied across the capacitor, and C is the capacitance. As is readily apparent from the above, $Z_{BB}$ presents an extremely large impedance for DC signals. However, as the frequency of the applied signal moves in either the positive or negative direction, away from DC (i.e., 0 MHz), the impedance $Z_{BB}$ decreases. Thus, capacitors $C_{BB1}$-$C_{BBN}$ effectively form a low-Q band-stop filter centered at baseband.

Since the impedance of capacitors $C_{BB1}$-$C_{BBN}$ varies with the frequency of the signal applied across their terminals, it follows that the frequency conversion of the RF signal by passive mixer 810 alters the impedance seen by the RF signal at input 850. Specifically, the impedance of capacitors $C_{BB1}$-$C_{BBN}$ will each appear translated by $\pm\omega_{LO}$ (i.e., the fundamental frequency of LO signals 860) as seen by the RF signal at input 850. In other words, the low-Q band-stop filter formed by baseband impedance 820 is substantially translated by $\pm\omega_{LO}$, becoming a high-Q band-stop filter presented at input 850. A high-Q band-stop filter is commonly referred to as a notch filter.

It can be shown that the translated baseband impedance ($Z_{IN}$) is substantially given by:

$$Z_{IN}(j\omega_{RF}) = R_{SW} + \frac{N}{\pi^2}\sin^2\left(\frac{\pi}{N}\right)\{Z_{BB}(j\omega_{RF} - j\omega_{LO}) + Z_{BB}(j\omega_{RF} + j\omega_{LO})\}$$

where $\omega_{RF}$ is the frequency of the RF signal received at input 850, $\omega_{LO}$ is the fundamental frequency of the LO signals received at LO coupling 860, $R_{SW}$ is the switch resistance of switching devices $M_1$-$M_N$, and N is the number of frequency conversion branches.

In an embodiment, $Z_{IN}$ is determined such that input 850 presents a high-impedance path to ground for frequency components of the RF signal within a desired frequency band and a low-impedance path to ground for frequency components of the RF signal outside the desired frequency band. The high-impedance (i.e., the notch) effectively precludes frequency components of the RF signal that are within the desired frequency band from being attenuated. Conversely, the low-impedance effectively allows frequency components of the RF signal outside the desired frequency band to be attenuated. In other words, frequency components of the RF signal outside the desired frequency band are filtered. The desired frequency band can be taken as an output at input 850, because the undesired frequency components have been shunted to ground.

Single-ended FTNF 400 illustrated in FIG. 4 represents the specific implementation of FTNF 800 with the variable N set equal to 4. That is, FTNF 400 has 4 frequency conversion branches, each branch comprising a switching device (e.g. an NMOS device) coupled at its gate to one of 4 different LO signals (i.e., $LO_{I+}$, $LO_{I-}$, $LO_{Q+}$, and $LO_{Q-}$), at its source to the RF signal ($RF_{IN}$), and at its drain to one of 4 different capacitors ($C_{BB1}$-$C_{BB4}$). In general, the value of N for a specific implementation of FTNF 800 can be selected based on the particular RF receiver or application it is intended for use within. Specifically, the value of N can be selected based on a range of frequencies in a spectrum that the RF receiver is intended to operate over. The determination and selection of the value of N will be described further below in regard to FIGS. 10 and 11.

Figure 9:
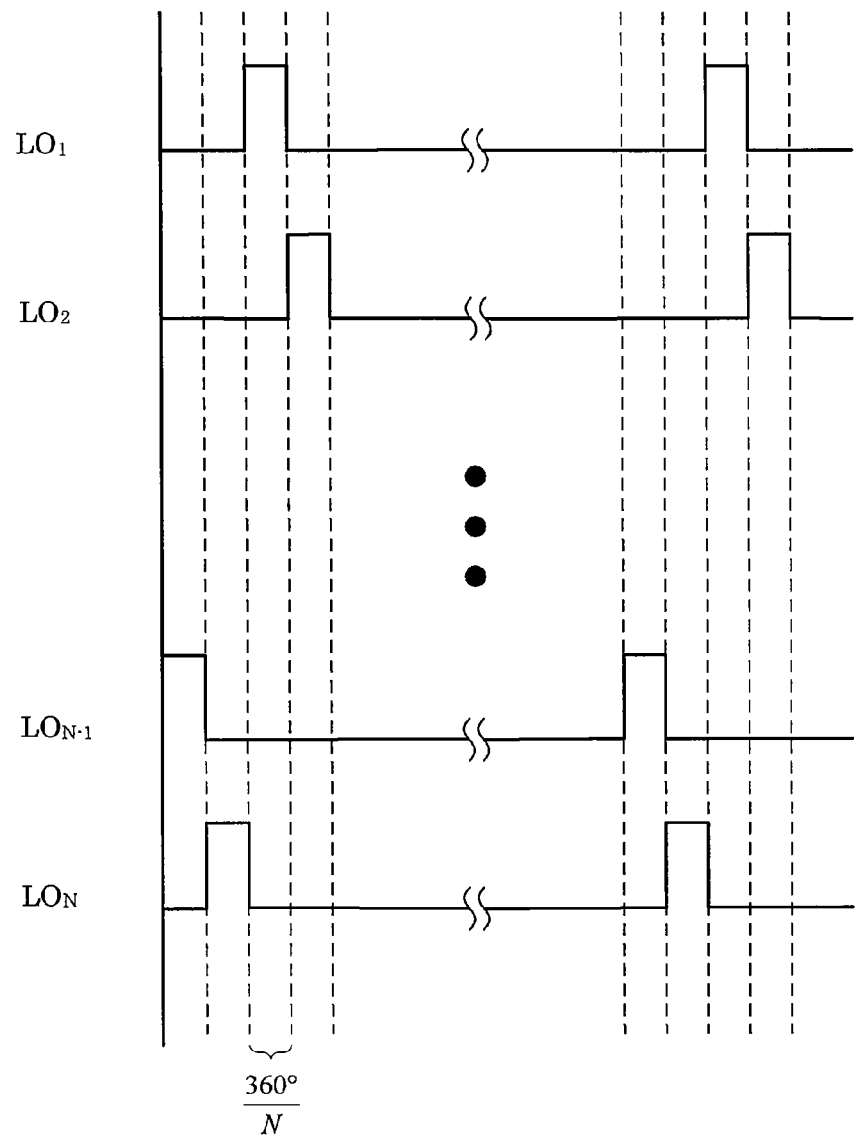
FIG. 9 illustrates a waveform diagram of exemplary LO signals for use by the passive mixer of the generalized FTNF illustrated in FIG. 8, according to embodiments of the present invention.

FIG. 9 illustrates a waveform diagram of exemplary LO signals 900 for use by passive mixer 810 illustrated in FIG. 8, according to embodiments of the present invention. LO signals 900 include N LO signals, $LO_1$-$LO_N$. The LO signals have successive phase shifts substantially equal to 360/N degrees and have duty cycles substantially equal to 1/N. In addition, the LO signals each have a fundamental frequency substantially equal to $\omega_{LO}$.

In the specific FTNF implementation illustrated in FIG. 4, where N is equal to 4, FTNF 400 utilizes 4 different LO signals; namely, $LO_{I+}$, $LO_{I-}$, $LO_{Q+}$, and $LO_{Q-}$. These four LO signals each have successive phase shifts substantially equal to 360/4 degrees or 90 degrees. In addition, the duty cycle of each LO signal is substantially equal to ¼ or 25%.

As noted above, the implementation of FTNF 800 illustrated in FIG. 8 provides frequency conversion of the RF signal, received at input 850, by the sum ($\omega_{RF}+\omega_{LO}$) and difference ($\omega_{RF}-\omega_{LO}$ or $\omega_{LO}-\omega_{RF}$) in frequency between LO signals 860 and the RF signal. However, due to the upper harmonics of LO signals 860, it can be shown that the implementation of FTNF 800 further provides frequency conversion of the RF signal by the sum ($\omega_{RF}+N^*\omega_{LO}$) and difference ($\omega_{RF}-N^*\omega_{LO}$ or $N^*\omega_{LO}-\omega_{RF}$) in frequency between the $N^{th}$ harmonic of LO signals 860 and the RF signal. Frequency conversion of the RF signal by the sum and difference in frequency between the Nth harmonic of LO signals 860 and the RF signal is undesired and can create adverse effects, especially in wideband applications. These adverse effects are described below in regard to FIGS. 10 and 11.

Figure 10:
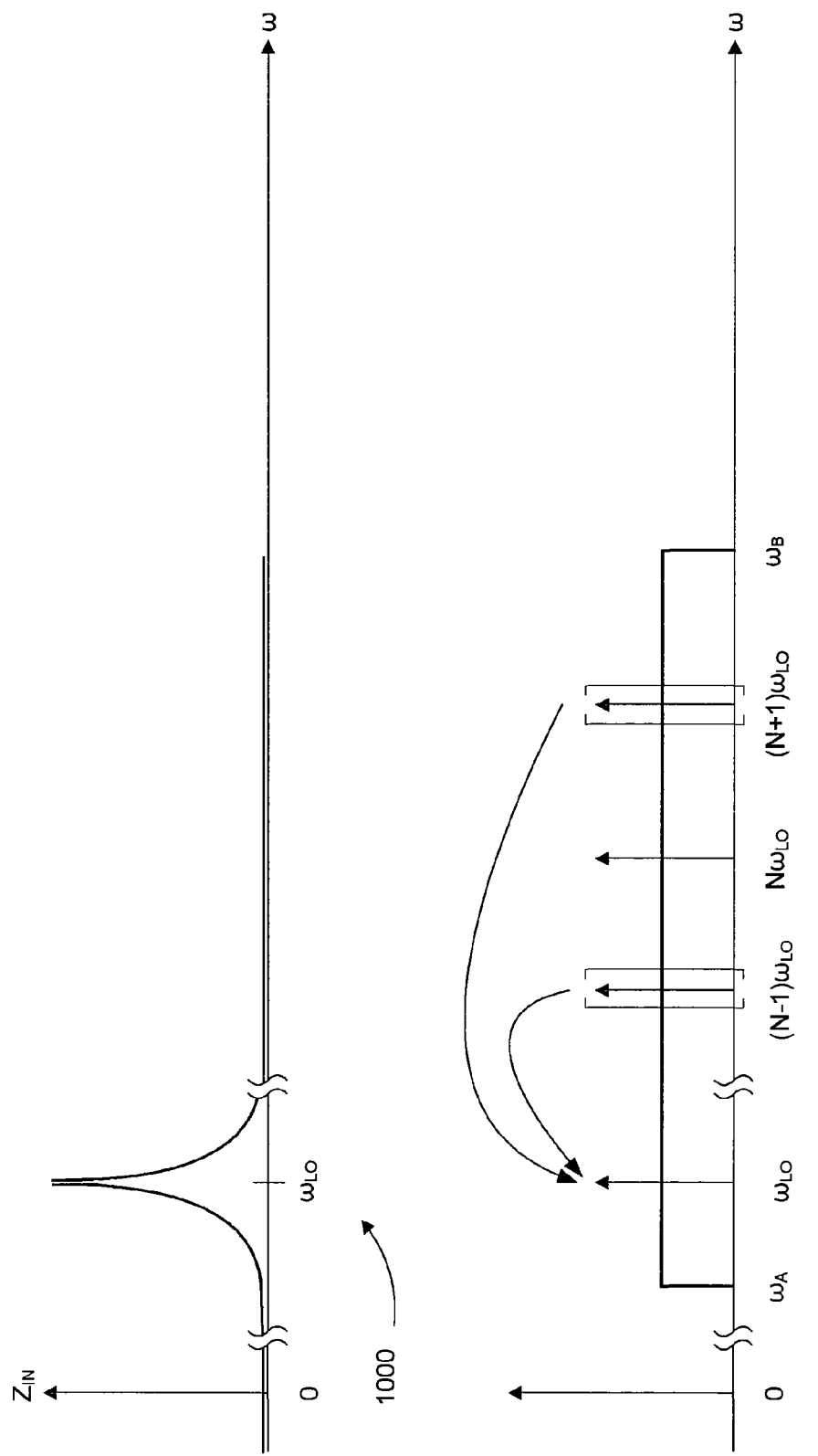
FIG. 10 illustrates a frequency versus magnitude response for an exemplary translated baseband impedance $Z_{IN}$ presented at an input of an FTNF and an exemplary spectrum for an RF signal received at the input of the FTNF, according to embodiments of the present invention.

FIG. 10 illustrates a frequency versus magnitude response 1000 for an exemplary translated baseband impedance $Z_{IN}$ presented at input 850 of FTNF 800. In addition, FIG. 10 further illustrates an exemplary spectrum 1010 for an RF signal received at input 850 of FTNF 800.

As illustrated in FIG. 10, frequency versus magnitude response 1000 of translated baseband impedance $Z_{IN}$ presents a notch centered at $\omega_{LO}$. The notch presents an extremely large impedance to the RF signal received at input 850 of FTNF 800. Specifically, the large impedance effectively prevents frequency components of the RF signal that fall within the notch from being passed to ground. However, the translated baseband impedance $Z_{IN}$ quickly decreases for frequency components of the RF signal that are offset from $\omega_{LO}$. Thus, these frequency components of the RF signal are passed to ground and are attenuated.

Exemplary spectrum 1010 of the RF signal received at input 850 illustrates a range of frequencies, $\omega_A$-$\omega_B$, that contain desired information. In an embodiment, $\omega_A$-$\omega_B$ spans the frequency spectrum from 3.1 GHz and 10.6 GHz and contains information communicated from a UWB transmitter. The translated baseband impedance $Z_{IN}$ is centered within a certain portion of the frequency band $\omega_A$-$\omega_B$, such that desired information contained at and around that frequency within the RF signal can be retrieved. Specifically, the translated baseband impedance $Z_{IN}$ is centered at $\omega_{LO}$.

In general, $\omega_{LO}$ can be adjusted to any frequency portion within the frequency band $\omega_A$-$\omega_B$. For example, the frequency band $\omega_A$-$\omega_B$ can be divided into channels that are each allocated to a single broadcast. At any given point in time the information contained in one particular channel may be desired. By adjusting $\omega_{LO}$ to have a frequency substantially equal to the center frequency of the desired channel, the translated baseband impedance $Z_{IN}$ can effectively provide a filter to attenuate frequency components of the RF signal outside the desired channel.

However, as noted above, the RF signal is frequency converted by the sum ($\omega_{RF}+N^*\omega_{LO}$) and difference ($\omega_{RF}-N^*\omega_{LO}$ or $N^*\omega_{LO}-\omega_{RF}$) in frequency between the $N^{th}$ harmonic of the LO signals 860 and the RF signal. Therefore, the frequency components of the RF signal at and around $(N-1)^*\omega_{LO}$ and $(N+1)^*\omega_{LO}$ will be substantially frequency-converted to $\omega_{LO}$ and will fall within the notch of translated baseband impedance $Z_{IN}$. The overlap of these components at $\omega_{LO}$ can detrimentally affect the desired information or channel centered at $\omega_{LO}$. In a worst case scenario, the overlapping of these components at $\omega_{LO}$ can prevent the desired information or channel centered at $\omega_{LO}$ from being recovered.

FIG. 10 illustrates the frequency components of the RF signal at and around $(N-1)^*\omega_{LO}$ and $(N+1)^*\omega_{LO}$. As can been seen from FIG. 10, these components of the RF signal are within the frequency band $\omega_A$-$\omega_B$. Because these frequency components are within the frequency band $\omega_A$-$\omega_B$, they ideally receive little or no attenuation from the packaging and components of the RF receiver, such as the antenna and transmit/receive (T/R) switch, to name a few. In other words, because these frequency components contain information that may be desired at any given point in time, these components ideally do not receive any significant attenuation from the packaging and components of the RF receiver. Therefore, because of the relative strength of these components, the overlap of these components with the frequency components of the desired channel centered at $\omega_{LO}$ can prevent the desired information from being recovered.

However, the value of N for a specific implementation of FTNF 800 can be selected such that the frequency components at $(N-1)^*\omega_{LO}$ and $(N+1)^*\omega_{LO}$ fall outside the frequency band $\omega_A$-$\omega_B$. Specifically, the value of N can be selected such that, for all values of $\omega_{LO}$ that fall within the frequency band $\omega_A$-$\omega_B$, the frequency components at $(N-1)^*\omega_{LO}$ and $(N+1)^*(\omega_{LO}$ fall outside the frequency band $\omega_A$-$\omega_B$. By pushing the frequency components at $(N-1)^*\omega_{LO}$ and $(N+1)^*\omega_{LO}$ outside the frequency band $\omega_A$-$\omega_B$, these components are less likely to prevent the desired information centered at $\omega_{LO}$ from being recovered. This is a direct result of the attenuation these signals typically receive from the packaging and components of the RF receiver, such as the antenna and transmit/receive (T/R) switch, to name a few.

The ability to determine the value of N for any given range of frequencies $\omega_A$-$\omega_B$, containing desired information, allows for the use of FTNF 800 in wideband receivers. In other words, the ability to determine the value of N allows for the adverse affects of higher-order harmonics in wideband applications to be limited. In general, as the bandwidth of the desired band increases, the value of N also increases.

Figure 11:
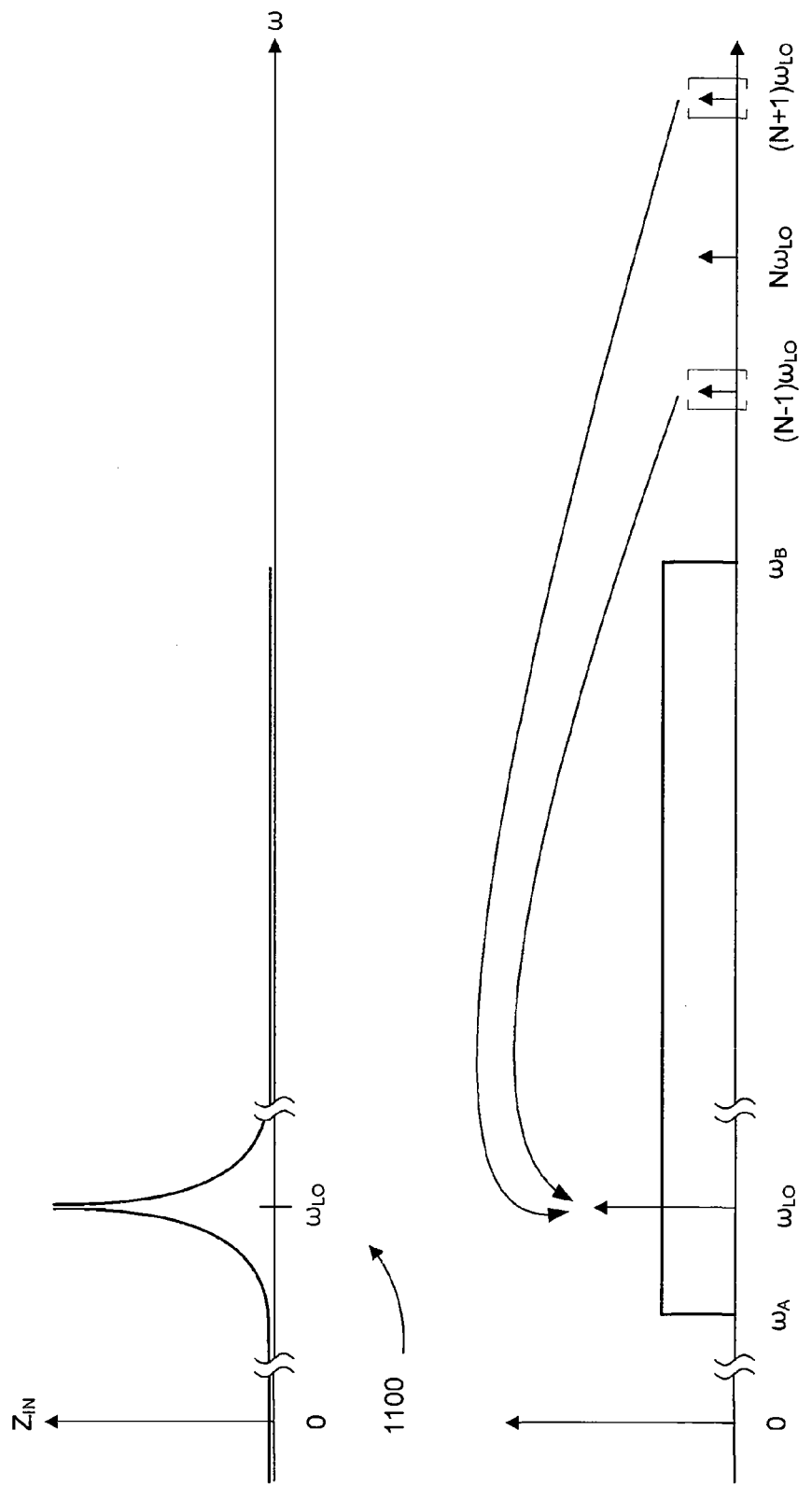
FIG. 11 illustrates a frequency versus magnitude response for an exemplary translated baseband impedance $Z_{IN}$ presented at an input of an FTNF and an exemplary spectrum for an RF signal received at the input of the FTNF, according to embodiments of the present invention.

FIG. 11 illustrates a frequency versus magnitude response 1100 for an exemplary translated baseband impedance $Z_{IN}$ presented at input 850 of FTNF 800. In addition, FIG. 11 further illustrates an exemplary spectrum 1110 for an RF signal received at input 850 of FTNF 800.

As illustrated by spectrum 1110, the value of N for FTNF 800 has been selected such that the frequency components at $(N-1)^*\omega_{LO}$ and $(N+1)^*\omega_{LO}$ fall outside the frequency band $\omega_A$-$\omega_B$. The frequency components at $(N-1)^*\omega_{LO}$ and $(N+1)^*\omega_{LO}$ are illustrated as being comparatively weaker than the frequency components of the RF signal centered at and around $\omega_{LO}$.

Figure 12:
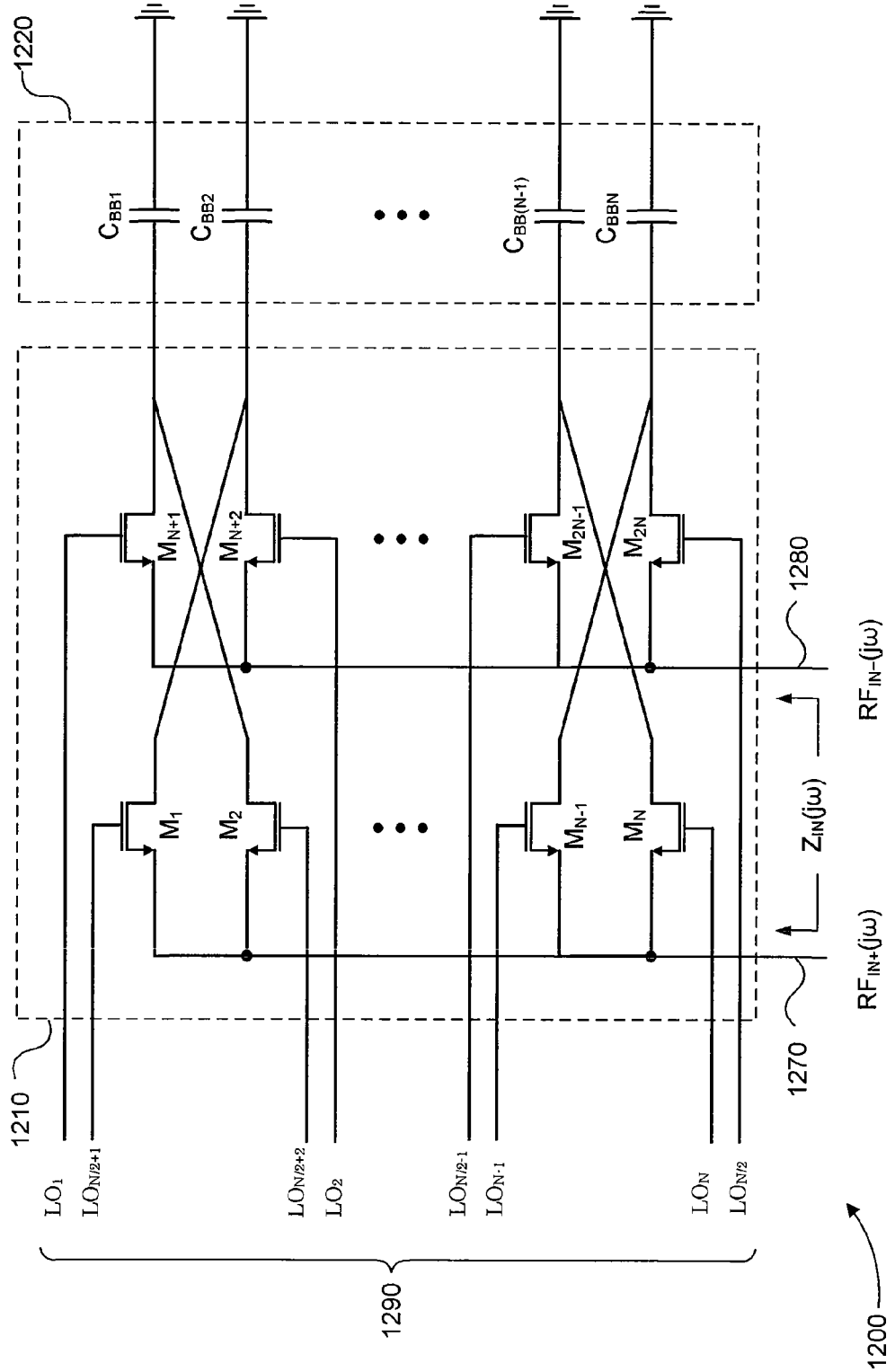
FIG. 12 illustrates a generalized, differential FTNF that can be designed for use in wideband RF receivers, according to embodiments of the present invention.

FIG. 12 illustrates a generalized, differential FTNF 1200 that can be designed for use in wideband RF receivers (e.g. UWB and TV receivers), according to embodiments of the present invention. FTNF 1200 is differential and receives a differential RF signal ($RF_{IN+}$ and $RF_{IN-}$) at differential input pair 1270 and 1280. FTNF 1200 includes a passive mixer 1210 and a baseband impedance 1220. Baseband impedance 1220 includes N capacitors, $C_{BB1}$-$C_{BBN}$, that form a low-Q band-stop filter. Passive mixer 1210 is configured to translate baseband impedance 1220 to a higher frequency. Specifically, passive mixer 1210 is configured to translate baseband impedance 1220 to a higher frequency substantially equal to the fundamental frequency $\omega_{LO}$ of LO signals 1290 received by passive mixer 1210. The translated baseband impedance ($Z_{IN}$) forms a high-Q band-stop filter (i.e., a notch filter) that is presented at differential input pair 1270 and 1280.

In general, differential FTNF 1200 is substantially similar in structure to single-ended FTNF 800 illustrated in FIG. 8. However, differential FTNF 1200 contains twice the number of frequency conversion branches as FTNF 800, each comprising a switching device (i.e., switching devices $M_1$-$M_{2N}$). Half of the 2*N frequency conversion branches of FTNF 1200 are dedicated to the positive-end of the RF signal received at input 1270 and the other half is dedicated to the negative-end of the RF signal received at input 1280. Moreover, it should be noted that N is assumed to be even for differential FTNF 1200. However, as will be appreciated by one of ordinary skill in the art, for an odd value of N, each frequency conversion branch of FTNF 1200 will require a separate capacitor within baseband impedance 1220. In other words, 2*N capacitors will be required for an implementation of FTNF 1200 with N equal to an odd integer.

4. CONCLUSION

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A frequency translated filter, comprising:
   a passive mixer comprising N frequency conversion branches, each of the N frequency conversion branches configured to mix a radio frequency (RF) signal received at a mixer input with a different one of N local oscillator (LO) signals, each of the N LO signals having a duty-cycle substantially equal to 1/N; and
   a baseband impedance coupled between an output of the passive mixer and ground,
   wherein the mixer input is coupled between an input stage and a cascode stage of a low noise amplifier (LNA) and is configured to present a high-impedance path to ground for frequency components of the RF signal within a frequency band of interest and a low-impedance path to ground for frequency components of the RF signal outside the frequency band of interest,
   wherein N is an integer number greater than four.

2. The frequency translated filter of claim 1, wherein the N LO signals have successive phase shifts substantially equal to 360/N degrees.

3. The frequency translated filter of claim 1, wherein N is determined based on the bandwidth of the frequency band of interest.

4. The frequency translated filter of claim 1, wherein the N LO signals each have a fundamental frequency substantially equal to $\omega_{LO}$.

5. The frequency translated filter of claim 4, wherein $\omega_{LO}$ is adjusted to have a frequency substantially equal to a center frequency of a channel within the frequency band of interest.

6. The frequency translated filter of claim 4, wherein N has a value such that a frequency component of the RF signal at $(N-1)*(\omega_{LO})$ is outside the frequency band of interest.

7. The frequency translated filter of claim 4, wherein $(N-1)*(\omega_{LO})$ is outside the frequency band of interest.

8. The frequency translated filter of claim 7, wherein $(N-1)$(o) is outside the frequency band of interest for any value of $\omega_{LO}$ within the frequency band of interest.

9. The frequency translated filter of claim 4, wherein an impedance seen by the RF signal at the mixer input is substantially equal to the baseband impedance translated in frequency by $\omega_{LO}$.

10. The frequency translated filter of claim 9, wherein the baseband impedance comprises at least one of a capacitor and an inductor.

11. The frequency translated filter of claim 10, wherein the baseband impedance forms a low quality factor (low-Q) filter.

12. The frequency translated filter of claim 11, wherein the translated baseband impedance seen by the RF signal at the mixer input forms a high quality factor (high-Q) filter.

13. The frequency translated filter of claim 12, wherein the high-Q filter is at least one of a band-pass or a notch filter.

14. A frequency translated filter, comprising:
   a passive mixer comprising N frequency conversion branches, each of the N frequency conversion branches configured to mix a radio frequency (RF) signal received at a mixer input with a different one of N local oscillator (LO) signals; and
   a baseband impedance coupled between an output of the passive mixer and ground,
   wherein the mixer input is coupled between an input stage and a cascode stage of a low noise amplifier (LNA) and is configured to present a high-impedance for frequency components of the RF signal within a frequency band and a low-impedance for frequency components of the RF signal outside the frequency band,
   wherein N is an integer number greater than four.

15. The frequency translated filter of claim 14, wherein the N LO signals have successive phase shifts substantially equal to 360/N degrees.

16. The frequency translated filter of claim 14, wherein N is determined based on the bandwidth of the frequency band.

17. The frequency translated filter of claim 14, wherein the N LO signals each have a fundamental frequency substantially equal to $\omega_{LO}$.

18. The frequency translated filter of claim 17, wherein $\omega_{LO}$ is adjusted to have a frequency substantially equal to a center frequency of a channel within the frequency band.

19. The frequency translated filter of claim 17, wherein N has a value such that a frequency component of the RF signal at $(N-1)*(\omega_{LO})$ is outside the frequency band.

20. The frequency translated filter of claim 17, wherein $(N-1)*(\omega_{LO})$ is outside the frequency band.

21. The frequency translated filter of claim 20, wherein $(N-1)*(\omega_{LO})$ is outside the frequency band of interest for any value of $\omega_{LO}$ within the frequency band.

22. The frequency translated filter of claim 20, wherein an impedance seen by the RF signal at the mixer input is substantially equal to the baseband impedance translated in frequency by $\omega_{LO}$.

23. The frequency translated filter of claim 22, wherein the baseband impedance comprises at least one of a capacitor and an inductor.

24. The frequency translated filter of claim 23, wherein the baseband impedance forms a low quality factor (low-Q) filter.

25. The frequency translated filter of claim 24, wherein the translated baseband impedance seen by the RF signal at the mixer input forms a high quality factor (high-Q) filter.

26. The frequency translated filter of claim 25, wherein the high-Q filter is at least one of a band-pass or a notch filter.

* * * * *

UNITED STATES PATENT AND TRADEMARK OFFICE
CERTIFICATE OF CORRECTION

PATENT NO. : 8,467,760 B2  
APPLICATION NO. : 12/497298  
DATED : June 18, 2013  
INVENTOR(S) : Mirzaei et al.

Page 1 of 1

It is certified that error appears in the above-identified patent and that said Letters Patent is hereby corrected as shown below:

In the Claims:

In column 18, Lines 31-32, please replace "(N-1)(o)" with --(N-1)*$\omega_{LO}$--.

Signed and Sealed this  
Sixth Day of August, 2013

Teresa Stanek Rea  
*Acting Director of the United States Patent and Trademark Office*